(12) United States Patent
Kato et al.

(10) Patent No.: US 8,421,081 B2
(45) Date of Patent: Apr. 16, 2013

(54) MEMORY DEVICE, MEMORY MODULE AND ELECTRONIC DEVICE

(75) Inventors: Kiyoshi Kato, Kanagawa (JP); Jun Koyama, Kanagawa (JP); Toshihiko Saito, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/331,645

(22) Filed: Dec. 20, 2011

(65) Prior Publication Data
US 2012/0161127 A1 Jun. 28, 2012

(30) Foreign Application Priority Data

Dec. 28, 2010 (JP) ................................ 2010-291861
May 14, 2011 (JP) ................................ 2011-108896

(51) Int. Cl.
*H01L 21/02* (2006.01)

(52) U.S. Cl.
USPC ........ 257/59; 257/40; 257/292; 257/E27.111; 257/E29.255; 257/E33.053

(58) Field of Classification Search .............. 257/40–43, 257/59, 292, 296, E21.046, 27.111, 29.068, 257/255, 33.019, 53, 51.001, 5, 18, 24
See application file for complete search history.

(56) References Cited

U.S. PATENT DOCUMENTS

| | | |
|---|---|---|
| 4,466,081 A | 8/1984 | Masuoka |
| 5,220,530 A | 6/1993 | Itoh |
| 5,349,366 A | 9/1994 | Yamazaki et al. |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,323,070 B1 * | 11/2001 | Yamazaki ..................... 438/162 |
| 6,563,174 B2 | 5/2003 | Kawasaki et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010: pp. 504-507.

(Continued)

*Primary Examiner* — Michael Lebentritt
(74) *Attorney, Agent, or Firm* — Fish & Richardson P.C.

(57) ABSTRACT

The first transistor includes first and second electrodes which are a source and a drain, and a first gate electrode overlapping with a first channel formation region with an insulating film provided therebetween. The second transistor includes third and fourth electrodes which are a source and a drain, and a second channel formation region which is provided between a second gate electrode and a third gate electrode with insulating films provided between the second channel formation region and the second gate electrode and between the second channel formation region and the third gate electrode. The first and second channel formation regions contain an oxide semiconductor, and the second electrode is connected to the second gate electrode.

18 Claims, 26 Drawing Sheets

U.S. PATENT DOCUMENTS

| | | | |
|---|---|---|---|
| 6,713,323 B2* | 3/2004 | Yamazaki et al. | 438/146 |
| 6,727,522 B1 | 4/2004 | Kawasaki et al. | |
| 6,992,928 B2 | 1/2006 | Inoue | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,710,364 B2* | 5/2010 | Ozawa et al. | 345/76 |
| 7,714,633 B2 | 5/2010 | Kato | |
| 7,732,819 B2 | 6/2010 | Akimoto et al. | |
| 8,030,643 B2* | 10/2011 | Asami et al. | 257/40 |
| 8,238,152 B2* | 8/2012 | Asami et al. | 365/174 |
| 8,247,967 B2* | 8/2012 | Ozawa et al. | 313/506 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0197466 A1* | 10/2003 | Yamazaki et al. | 313/504 |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0240305 A1 | 12/2004 | Kato | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0147165 A1 | 6/2007 | Kato | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272759 A1 | 11/2007 | Kato | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Wasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2010/0148845 A1 | 6/2010 | Kato | |
| 2010/0193785 A1 | 8/2010 | Kimura | |
| 2011/0156025 A1 | 6/2011 | Shionoiri et al. | |
| 2011/0215318 A1* | 9/2011 | Yamazaki et al. | 257/43 |
| 2012/0161126 A1* | 6/2012 | Yamazaki | 257/43 |
| 2012/0228607 A1* | 9/2012 | Miyairi et al. | 257/43 |
| 2012/0273778 A1* | 11/2012 | Asami et al. | 257/43 |
| 2012/0278780 A1* | 11/2012 | Tetelbaum et al. | 716/113 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 06-021478 A | 1/1994 |
| JP | 08-264794 A | 10/1996 |
| JP | 10-084047 A | 3/1998 |
| JP | 11-505377 A | 5/1999 |
| JP | 2000-044236 A | 2/2000 |
| JP | 2000-150900 A | 5/2000 |
| JP | 2001-230329 A | 8/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-308691 A | 10/2003 |
| JP | 2004-103957 A | 4/2004 |
| JP | 2004-273614 A | 9/2004 |
| JP | 2004-273732 A | 9/2004 |
| JP | 2005-322899 A | 11/2005 |
| JP | 2006-165532 A | 6/2006 |
| JP | 2009-033145 A | 2/2009 |
| JP | 2009-182194 A | 8/2009 |
| WO | 2004/114391 A1 | 12/2004 |
| WO | 2009/110623 A1 | 9/2009 |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Wonchan Kim et al.; "An Experimental High-Density Dram Cell with a Built-in Gain Stage"; IEEE Journal of Solid State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.
Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Yet al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.
Hayashi, Ret al., "42.1: Invited Paper: Improved Amorphous In-Ga-Zn-O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTS) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using Cg-Silicon Technology,"SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al. ' "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "Suftla Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of The 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on srTiO3 with Sputtered Al2O3 Gate insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

● In
☾ Sn
☾ Zn
● O

MEMORY DEVICE, MEMORY MODULE AND ELECTRONIC DEVICE

BACKGROUND OF THE INVENTION

1. Field of the Invention

The present invention relates to memory devices. In particular, one embodiment of the present invention relates to a structure of a memory cell for retaining data.

2. Description of the Related Art

A memory device utilizing semiconductor characteristics (hereinafter just referred to as a memory device) has been equipped for a variety of electronic devices and put into many products. Memory devices can be roughly classified into a volatile memory and a nonvolatile memory. The volatile memory includes in its category a register, an SRAM (static random access memory), and a DRAM (dynamic random access memory); the nonvolatile memory includes in its category a Flash EEPROM (flash memory).

The SRAM, which retains stored data with a circuit such as a flip flop, involves a large number of elements per memory cell (for example, six transistors per memory cell), increasing the cost per storage capacity.

On the other hand, the DRAM has a simple structure where each memory cell consists of a transistor and a capacitor. Therefore, as compared to the other volatile memories, the number of semiconductor elements included in each memory cell is less, so that the storage capacity per unit area can be increased and the cost can be reduced. However, in the DRAM, data is lost in reading stored data, and electric charge is leaked from the transistor as time passes, whereby stored data is lost; thus, a refresh operation needs to be repeated several tens of times per second. The repeat of the refresh operation leads to an increase in power consumption.

Patent Document 1 discloses a structure of a DRAM where a volatile memory and a nonvolatile memory are combined so that a refresh operation does not need to be performed.

REFERENCE

Patent Document 1: Japanese Published Patent Application No. 2003-308691

SUMMARY OF THE INVENTION

The flash memory that is a nonvolatile memory needs a voltage of about 20 V as the absolute value of a voltage, which is higher than that of a volatile memory, when electric charge is accumulated in its floating gate (also referred to as a charge accumulation layer). The large voltage value leads to an increase in power consumption in repeating an operation. Therefore, in order to prioritize a reduction in power consumption, a DRAM with a simple structure where each memory cell consists of a transistor and a capacitor, which can be operated at a low voltage, has been adopted in many cases.

However, in the simple structure of the DRAM where each memory cell consists of a transistor and a capacitor, which can be operated at a low voltage, written data is destroyed when data is read out; thus, it is necessary that even the same data be written repeatedly. Accordingly, the power consumption is increased by a repeat of a refresh operation.

In view of the foregoing, one object of one embodiment of the present invention is to provide a memory device with the frequency of a refresh operation reduced. Further, one object of one embodiment of the present invention is to provide a memory device from which data can be read out without destroying written data.

One embodiment of the present invention is a memory device including a plurality of memory cells each including a first transistor and a second transistor. The first transistor includes a first electrode which is one of a source and a drain, a second electrode which is the other of the source and the drain, and a first gate electrode which overlaps with a first channel formation region with an insulating film provided therebetween. The second transistor includes a third electrode which is one of a source and a drain, a fourth electrode which is the other of the source and the drain, and a second channel formation region which is provided between a second gate electrode and a third gate electrode with insulating films provided between the second channel formation region and the second gate electrode and between the second channel formation region and the third gate electrode. The first channel formation region and the second channel formation region contain an oxide semiconductor, and the second electrode is directly connected to the second gate electrode.

One embodiment of the present invention is a memory device including a plurality of memory cells each including a first transistor and a second transistor. The first transistor includes a first electrode which is one of a source and a drain, a second electrode which is the other of the source and the drain, and a first gate electrode which overlaps with a first channel formation region with an insulating film provided therebetween. The second transistor includes a third electrode which is one of a source and a drain, a fourth electrode which is the other of the source and the drain, and a second channel formation region which is provided between a second gate electrode and a third gate electrode with insulating films provided between the second channel formation region and the second gate electrode and between the second channel formation region and the third gate electrode. The first channel formation region and the second channel formation region contain an oxide semiconductor, and the second electrode is directly connected to the second gate electrode. The area where an active layer including the first channel formation region overlaps with the first gate electrode is smaller than that where an active layer including the second channel formation region overlaps with the second gate electrode or the third gate electrode.

One embodiment of the present invention is a memory device in which the active layer including the first channel formation region of the first transistor includes a region whose resistance is reduced by adding a dopant and the first gate electrode is spaced from the first and second electrodes by the region in the above-described structure.

One embodiment of the present invention is a memory device in which the first transistor is provided in a layer different from that in which the second transistor is provided in the above-described structure.

One embodiment of the present invention is a memory device in which the area where the active layer including the second channel formation region overlaps with the second gate electrode is larger than that where the active layer including the second channel formation region overlaps with the third gate electrode in the above-described structure.

One embodiment of the present invention is a memory device in which the first electrode is electrically connected to the third electrode in the above-described structure.

One embodiment of the present invention is a memory device in which the oxide semiconductor is an In—Ga—Zn—O-based oxide semiconductor in the above-described structure.

According to one embodiment of the present invention, a memory device whose power consumption can be reduced by decreasing the frequency of a refresh operation without increasing a voltage to be applied can be provided. Further, according to one embodiment of the present invention, a memory device from which data can be read out without destroying written data can be provided.

BRIEF DESCRIPTION OF THE DRAWINGS

In the accompanying drawings.

DETAILED DESCRIPTION OF THE INVENTION

Figure 1A:
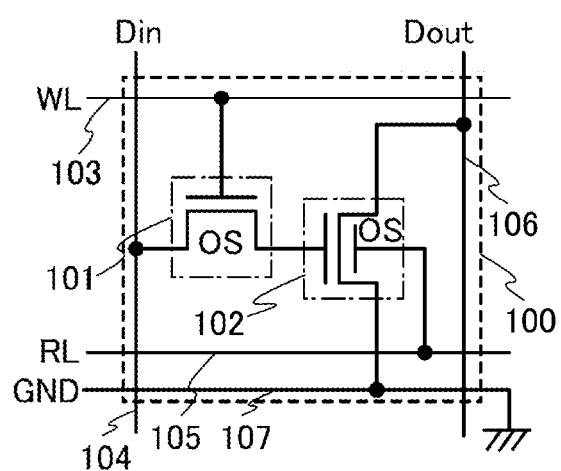
FIGS. 1A and 1B illustrate Embodiment 1.

Embodiments and an example of the present invention are hereinafter described with reference to the accompanying drawings. However, the present invention can be carried out in many different modes, and those skilled in the art could appreciate that a variety of modifications can be made to the embodiment and details of the present invention without departing from the spirit and scope of the present invention. Therefore, the present invention is not construed as being limited to the content of the embodiments and example included herein. The same portions are denoted by the same reference symbols throughout the drawings in the structure of the present invention described below.

Note that the size, the thickness of a layer, the signal waveform, or the region of each structure shown in the drawings or the like of the embodiments and example is exaggerated for simplicity in some cases. Therefore, any embodiment of the present invention is not limited to such scales.

In this specification, ordinal numbers such as "first", "second", "third", . . . "N-th (N is a natural number)" are used in order to avoid confusion between elements, and do not limit the elements numerically.

Embodiment 1

FIG. 1A illustrates one example of a circuit diagram of a memory cell which is the minimum unit of a memory device of one embodiment of the present invention. A memory cell 100 illustrated in FIG. 1A includes a first transistor 101 serving as a switching element, and a second transistor 102 serving as a memory element. The first transistor 101 functions as a switching element to supply a potential of an input data line to a second gate electrode of the second transistor 102.

The first transistor 101 serving as a switching element includes a first electrode which is one of a source and a drain, a second electrode which is the other of the source and the drain, a first channel formation region formed using a semiconductor material whose bandgap is wider than that of silicon and whose intrinsic carrier deinsity is lower than that of silicon, and a first gate electrode. With the semiconductor material whose intrinsic carrier density is lower than that of silicon, which is used for the first channel formation region, the off-state current of the first transistor 101 can be sufficiently reduced.

The second transistor 102 serving as a memory element includes a third electrode which is one of a source and a drain, a fourth electrode which is the other of the source and the drain, a second channel formation region, a second gate electrode, and a third gate electrode. The second channel formation region is provided between the second gate electrode and the third gate electrode. It is preferable that the second channel formation region be formed using a semiconductor material whose intrinsic carrier density is lower than that of silicon like the first channel formation region; however, a material of the second channel formation region is not particularly limited as long as the material is the semiconductor material which can be provided between the second gate electrode and the third gate electrode.

As an example of the semiconductor material whose bandgap is wider than that of silicon and whose intrinsic carrier density is lower than that of silicon, which can be used for the first channel formation region and the second channel formation region, a compound semiconductor such as silicon carbide (SiC) or gallium nitride (GaN), an oxide semiconductor formed using a metal oxide such as zinc oxide (ZnO), or the like can be given. Among these, an oxide semiconductor which can be formed by a sputtering method, a wet process (e.g., a printing method), or the like has an advantage of high mass productivity. In addition, the deposition temperature of the oxide semiconductor is as low as 300° C. to 500° C. (the glass transition temperature or lower, about 700° C. at the maximum), whereas the deposition temperature of silicon carbide and that of gallium nitride are about 1500° C. and about 1100° C., respectively; therefore, the oxide semiconductor can be deposited on a glass substrate which is inexpensively available. Further, the oxide semiconductor makes it possible to use a larger substrate. Still further, with the oxide semiconductor, the second channel formation region in the second transistor 102 can be formed between the second gate electrode and the third gate electrode. Accordingly, among the semiconductors with wide bandgaps, the oxide semiconductor particularly has an advantage of high mass productivity. Further, in the case where an oxide semiconductor is provided with crystallinity to improve the property of a transistor (e.g., field-effect mobility), the oxide semiconductor can be easily provided with crystallinity by heat treatment at 450° C. to 800° C.

The oxide semiconductor is an intrinsic (also called an i-type) or substantially intrinsic semiconductor, as which a material in which the number of carriers is very small and the carrier concentration is less than $1\times10^{14}/cm^3$, preferably less than $1\times10^{12}/cm^3$, further preferably less than $1\times10^{11}/cm^3$ is used.

The off-state current of the transistor including the above-described oxide semiconductor in its channel formation region can be reduced to 100 yA ($1\times10^{-22}$ A) or less per micrometer in the channel width, preferably 10 yA ($1\times10^{-23}$ A) or less per micrometer in the channel width, further preferably 1 yA ($1\times10^{-24}$ A) or less per micrometer in the channel width. Accordingly for example, when the capacitance of the second gate electrode of the second transistor 102 is 1 fF and the off-state current of the second transistor 102 is 1 yA, data can be retained even with a frequency of the refresh operation as low as once every ten years.

As the oxide semiconductor, a non-single crystal oxide semiconductor having a phase which has a triangular, hexagonal, equilateral triangular, or equilateral hexagonal atomic arrangement when seen from the direction perpendicular to the a-b plane and in which metal atoms are arranged in a layered manner along the c-axis, or metal atoms and oxygen atoms are arranged in a layered manner along the c-axis can be used. For example, an oxide semiconductor film is deposited at a substrate temperature of higher than or equal to 100° C. and lower than or equal to 500° C., and then the oxide semiconductor film is subjected to heat treatment, so that an oxide semiconductor layer containing crystals aligned perpendicular to a top surface of the layer can be formed. With the oxide semiconductor layer containing crystals aligned perpendicular to the top surface of the layer, a change in electrical characteristics of a transistor due to light can be suppressed, for example.

Described below is an example of the case where an oxide semiconductor having the above-described features is used as a semiconductor material for the first channel formation region and the second channel formation region. In the drawings, a circuit symbol that represents a transistor where an oxide semiconductor is used for its channel formation region is labeled with "OS".

Although the memory cell 100 includes one first transistor 101 serving as a switching element in FIG. 1A, one embodiment of the present invention is not limited to this structure. In one embodiment of the present invention, the number of first transistors 101 each serving as a switching element is one or more in each memory cell.

Further, in one embodiment of the present invention, at least the first channel formation region of the first transistor 101 serving as a switching element is formed using the above-described wide bandgap semiconductor material. The second channel formation region of the second transistor 102 serving as a memory element may also be formed using an oxide semiconductor which is the same semiconductor material as the first channel formation region; in that case, respective processes for manufacturing the transistors can be partly in common with each other. Alternatively, for the second channel formation region of the second transistor 102 serving as a memory element, the following semiconductor material other than the oxide semiconductor may be used: amorphous silicon, microcrystalline silicon, polycrystalline silicon, single crystal silicon, amorphous germanium, microcrystalline germanium, polycrystalline germanium, single crystal germanium, or the like.

Next, a connection relation of the first transistor 101 and the second transistor 102 in the memory cell 100 in FIG. 1A is described.

The first gate electrode of the first transistor 101 is connected to a writing word line WL (wiring 103). The first electrode which is one of the source and the drain of the first transistor 101 is connected to an input data line Din (wiring 104, also called a bit line), and the second electrode of the other of the source and the drain is connected to the second gate of the second transistor 102. Further, the third gate electrode of the second transistor 102 is connected to a reading word line RL (wiring 105). The third electrode which is one of the source and the drain of the second transistor 102 is connected to an output data line Dout (wiring 106), and the fourth electrode of the other of the source and the drain is connected to a power source line GND (wiring 107) to which a fixed potential such as a ground potential is supplied.

In this specification, the case where one element "is connected to" the other element includes in its category the case where one element is electrically connected to the other element in addition to the case where one element is directly connected to the other element. Here, the case where one element "is electrically connected to" the other element refers to the case where the potentials of one element and the other element are not substantially changed even with an object having an electrical function provided between the elements.

Figure 1B:
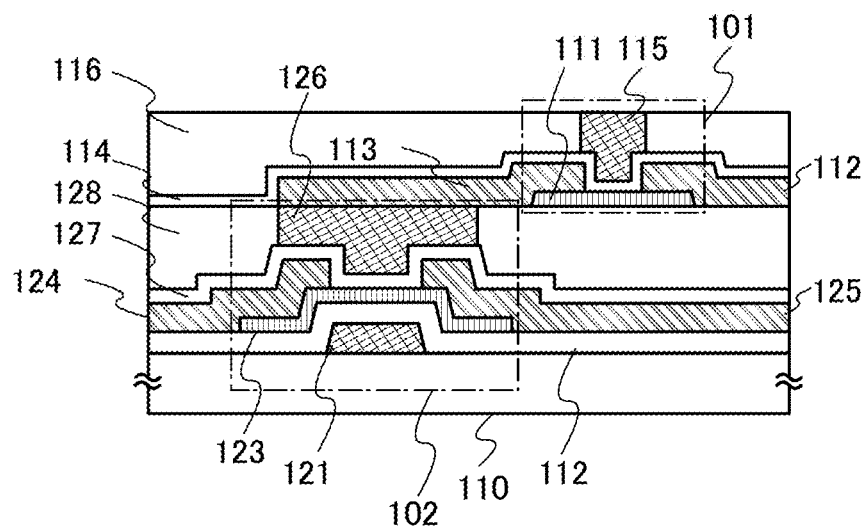

Next, FIG. 1B illustrates one example of a cross-sectional view of the memory cell 100 having the circuit structure in FIG. 1A. In FIG. 1B, the first transistor 101 serving as a switching element and the second transistor 102 serving as a memory element are formed over a substrate 110 having an insulating surface. In particular, FIG. 1B illustrates an example in which the first transistor 101 is formed above the second transistor 102; according to that structure, the integration degree of memory cells can be increased. As an alternative to the structure shown in FIG. 1B, respective semiconductor materials and/or respective electrode materials of the first transistor 101 and the second transistor 102 may be formed in the same layer(s), whereby respective processes for manufacturing the transistors can be partly in common with each other.

The second transistor 102 in FIG. 1B includes over the substrate 110 having an insulating surface: a third gate electrode 121; an insulating film 122 over the third gate electrode 121; an oxide semiconductor film 123 including a channel formation region, which overlaps with the third gate electrode 121 with the insulating film 122 provided therebetween; a third electrode 124 and a fourth electrode 125 over the oxide semiconductor film 123; an insulating film 127 over the oxide semiconductor film 123, the third electrode 124, and the fourth electrode 125; a second gate electrode 126 which overlaps with the oxide semiconductor film 123 over the insulating film 127; and an insulating film 128 for planarizing unevenness in the region other than the region where the second gate electrode 126 is provided over the insulating film 127.

Further, the first transistor 101 in FIG. 1B includes over the insulating film 128: an oxide semiconductor film 111 including a channel formation region; a first electrode 112 and a second electrode 113 over the oxide semiconductor film 111; an insulating film 114 over the oxide semiconductor film 111, the first electrode 112, and the second electrode 113; a first gate electrode 115 which overlaps with the oxide semiconductor film 111 over the insulating film 114; and an insulating film 116 for planarizing unevenness in the region other than the region where the first gate electrode 115 is provided over the insulating film 114. In addition, the second gate electrode 126 is directly connected to the second electrode 113 in FIG. 1B. Although the first transistor 101 is provided above the second transistor 102 over the substrate 110 in FIG. 1B, the second transistor 102 may be provided above the first transistor 101 over the substrate.

Figure 2A:
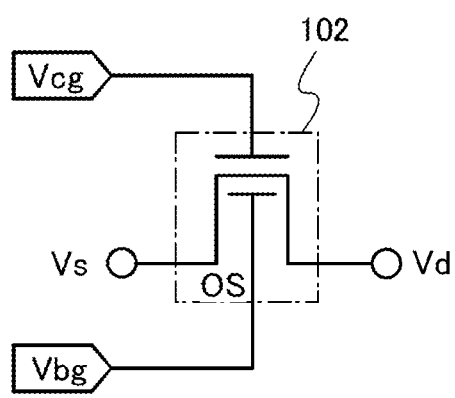
FIGS. 2A and 2B illustrate Embodiment 1.

Described next is an operation of the second transistor 102 serving as a memory element, using an example in which the second transistor 102 is an n-channel transistor and binary data is handled, with reference to FIGS. 2A and 2B. FIG. 2A is a circuit diagram of the second transistor 102, where respective potentials of the electrodes of the second transistor 102 are denoted as follows: the potential of the second gate electrode is Vcg; the potential of the third gate electrode is Vbg; the potential of the third electrode (hereinafter referred to as a drain electrode) is Vd; and the potential of the fourth electrode (hereinafter referred to as a source electrode) is Vs.

Figure 2B:
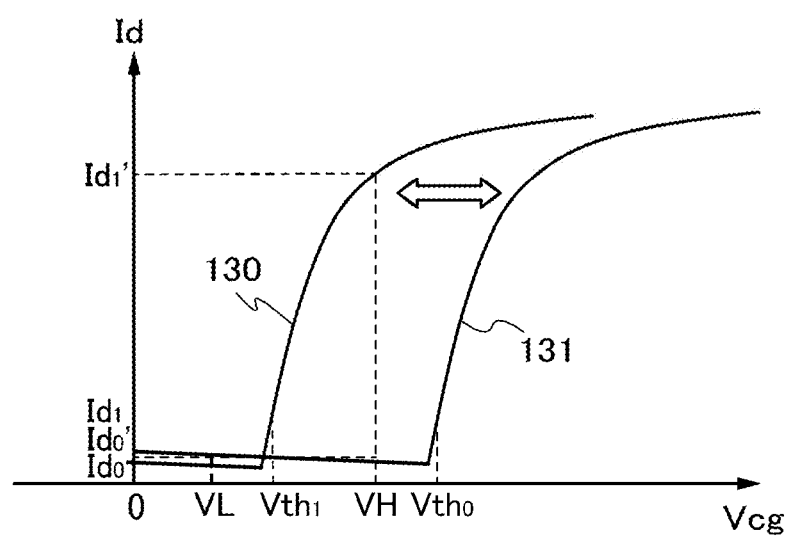

In the description of FIGS. 2A and 2B, the threshold voltage of the second transistor 102 is changed between two values, a threshold voltage $Vth_0$ and a threshold voltage $Vth_1$, depending on the voltage between the third gate electrode and the source electrode, where $0 < Vth_1 < Vth_0$. In addition, the threshold voltage $Vth_0$ is the threshold voltage of the second transistor 102 when the potential Vbg of the third gate electrode is less than or equal to a ground potential Vgnd. Thus, for example, in the case where the potential Vbg of the third gate electrode is the ground potential Vgnd, the threshold voltage of the second transistor 102 is the threshold voltage $Vth_0$. The threshold voltage $Vth_1$ corresponds to the threshold voltage of the second transistor 102 in the case where the potential Vbg of the third gate electrode is greater than or equal to Vss and less than Vdd where Vgnd<Vss<Vdd. Thus, for example, in the case where the potential Vbg of the third gate electrode is Vss, the threshold voltage of the second transistor 102 is the threshold voltage $Vth_1$ which is shifted in the negative direction with respect to the threshold voltage $Vth_0$. The potential Vdd is a potential at which the second transistor 102 is turned on in the case where the potential Vcg of the second gate electrode of the second transistor 102 is the ground potential Vgnd.

First, an operation of the second transistor 102 in data writing is described below. In writing data, the second transistor 102 is applied with a voltage between the third gate electrode and the source electrode such that the threshold voltage of the second transistor 102 becomes the threshold voltage $Vth_0$. In addition, the potential Vcg of the second gate electrode is set such that $Vcg - Vs \leq Vth_0$ is satisfied in data writing. Consequently, the second transistor 102 is in an off state in data writing and the drain electrode of the second transistor 102 is in a high impedance state.

As for the potential Vcg of the second gate electrode, a high potential or a low potential is set in accordance with the value of data in writing data. Specifically, in the case of writing binary data, either a high potential VH or a low potential VL is supplied to the second gate electrode. The high potential VH and the low potential VL satisfy $VH - Vs \leq Vth_0$, $VL - Vs \leq Vth_0$, $VH - Vs > Vth_1$, and $VL - Vs > Vth_1$.

Next, an operation of the second transistor 102 in data retention is described below. In retaining data, the first transistor 101 serving as a switching element is in an off state. Since the off-state current of the first transistor 101 is extremely small as described above, the level of the potential Vcg of the second gate electrode, which is set in the data writing, is retained for a while.

Next, an operation of the second transistor 102 in data reading is described below. In reading data, the second transistor 102 is applied with a voltage between the third gate electrode and the source electrode such that the threshold voltage of the second transistor 102 becomes the threshold voltage $Vth_1$. Thus, as described above, the potential Vbg of the third gate electrode is set at the potential Vss.

Before the data reading, the high potential VH or the low potential VL is supplied as the potential Vcg of the second gate electrode at the data writing. In the case where the potential Vcg of the second gate electrode is the high potential VH, in reading data, the voltage between the second gate electrode and the source electrode is higher than the threshold voltage $Vth_1$, and thus the resistance between the source electrode and the drain electrode decreases, so that the second transistor 102 is turned on. Consequently, the potential Vs of the source electrode is supplied to the drain electrode of the second transistor 102. On the other hand, in the case where the potential Vcg of the second gate electrode is the low potential VL, in reading data, the voltage between the second gate electrode and the source electrode is lower than the threshold voltage $Vth_1$ to keep the second transistor 102 off; consequently, the resistance between the source electrode and the drain electrode is high, so that the drain electrode keeps high impedance.

In this manner, the potential Vd of the drain electrode is changed in accordance with the level of the potential supplied to the second gate electrode in data writing prior to the data reading. FIG. 2B is a graph for describing a relation between the potential Vcg of the second gate electrode and the drain current Id of the second transistor 102 in data reading. A curve 130 indicates a relation between the potential Vcg and the drain current Id at the threshold voltage of $Vth_1$; a curve 131 indicates a relation between the potential Vcg and the drain current Id at the threshold voltage of $Vth_0$.

In the case where the potential Vbg of the third gate electrode is the ground potential Vgnd and thus the threshold voltage of the second transistor 102 is $Vth_0$, a drain current $Id_0'$ is obtained when the potential Vcg of the second gate electrode is the high potential VH, and a drain current $Id_0$ is obtained when the potential Vcg of the second gate electrode is the low potential VL. The drain current $Id_0'$ and the drain current $Id_0$ are small as seen from the curve 131, which indicates that the resistance between the source electrode and the drain electrode is high in the case where the threshold voltage of the second transistor 102 is $Vth_0$, i.e., except in data reading.

On the other hand, in the case where the potential Vbg of the third gate electrode is the potential Vss and thus the threshold voltage of the second transistor 102 is $Vth_1$, a drain current $Id_1'$ is obtained when the potential Vcg of the second gate electrode is the high potential VH, and a drain current $Id_1$ is obtained when the potential Vcg of the second gate electrode is the low potential VL. The drain current $Id_1$ is small and the drain current $Id_1'$ is large as seen from the curve 130, which indicates that the value of written data can be detected by reading the drain current or the potential Vd of the drain electrode in the case where the threshold voltage of the second transistor 102 is $Vth_1$, i.e., in data reading.

Although binary data is used in this embodiment, multi-valued data having three or more bits can also be handled with a memory device of one embodiment of the present invention.

According to one embodiment of the present invention, data can be written and read by a switching element including a highly-purified oxide semiconductor film as its channel formation region. Accordingly, the voltage needed for operating the memory device is as low as several volts, so that power consumption can be remarkably reduced. Further, the highly-purified oxide semiconductor film used as the channel formation region of the transistor makes it possible to prolong the retention time of written data. Accordingly, the frequency of a refresh operation can be reduced. In this manner, power consumption can be reduced according to this embodiment. Further, data can be read out without destroying written data. Accordingly, it is not necessary to write the same data again, by which power consumption can be reduced.

This embodiment can be implemented in appropriate combination with any structure described in the other embodiments.

Embodiment 2

In this embodiment, an example of a structure of a memory device including a plurality of memory cells and an example of a driving method thereof are described.

Figure 3:
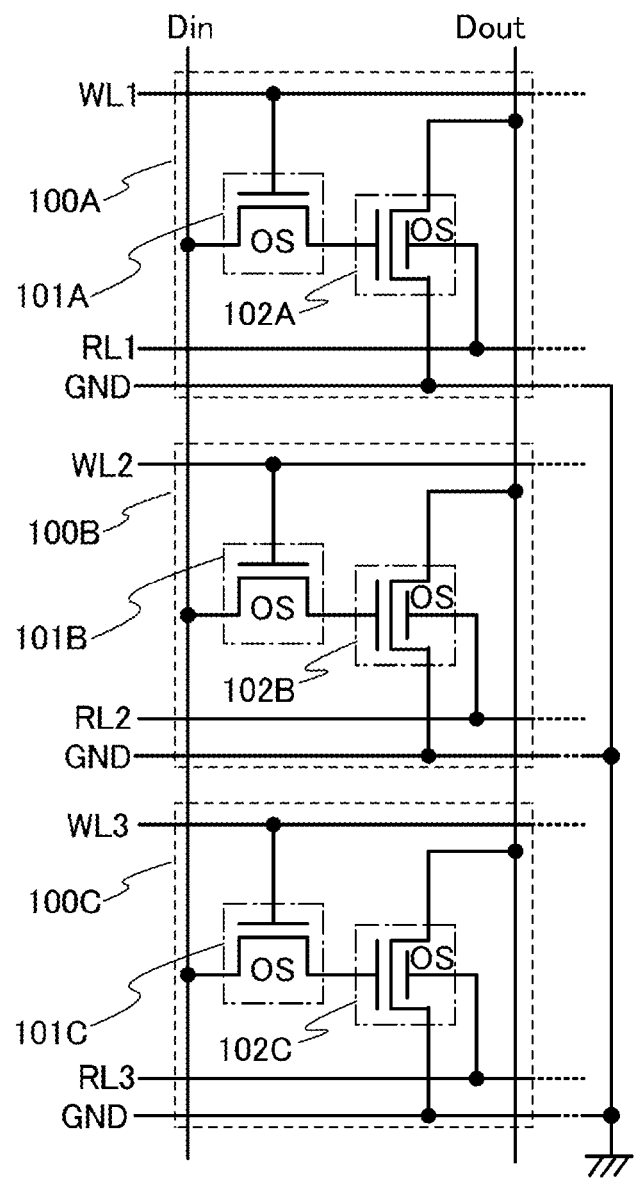
FIG. 3 illustrates Embodiment 2.

As an example, FIG. 3 illustrates a circuit diagram of a cell array in a NOR-type memory device in which a plurality of memory cells 100A to 100C is arranged in a matrix manner. The description of FIG. 1A in Embodiment 1 can be referred to for the structure of each memory cell 100A, 100B, 100C in the memory device illustrated in FIG. 3.

Specifically, the memory cell 100A, 100B, 100C includes a first transistor 101A, 101B, 101C functioning as a switching element for controlling the supply of a potential to a second gate electrode of a second transistor 102A, 102B, 102C, and the second transistor 102A, 102B, 102C functioning as a memory element.

The cell array in FIG. 3 includes a variety of wirings such as a plurality of input data lines Din, a plurality of output data lines Dout, a plurality of writing word lines WL, and a plurality of reading word lines RL, through which a power supply potential and a signal from a driver of the cell array are supplied to the memory cell 100A, 100B, 100C. Thus, the number of wirings can be determined by the number of memory cells and arrangement of the memory cells. Specifically, the cell array in FIG. 3 includes the memory cells which are connected in a matrix manner of three rows by one column, and at least one input data line Din, one output data line Dout, writing word lines WL1 to WL3, and reading word lines RL1 to RL3 are provided for the cell allay.

One of the memory cells 100A to 100C, the memory cell 100A which is connected to the input data line Din, the output data line Dout, the writing word line WL1, and the reading word line RL1 is given as an example to describe the connection to circuit elements in the memory cell. A first gate electrode of the first transistor 101A is connected to the writing word line WL1. Further, a first electrode of the first transistor 101A is connected to the input data line Din and a second electrode of the same is connected to a second gate electrode of the second transistor 102A. A third gate electrode of the second transistor 102A is connected to the reading word line RL1. Further, a drain electrode of the second transistor 102A is connected to the output data line Dout and a source electrode of the same is connected to a power supply line GND to which a fixed potential such as a ground potential is supplied.

Figure 4:
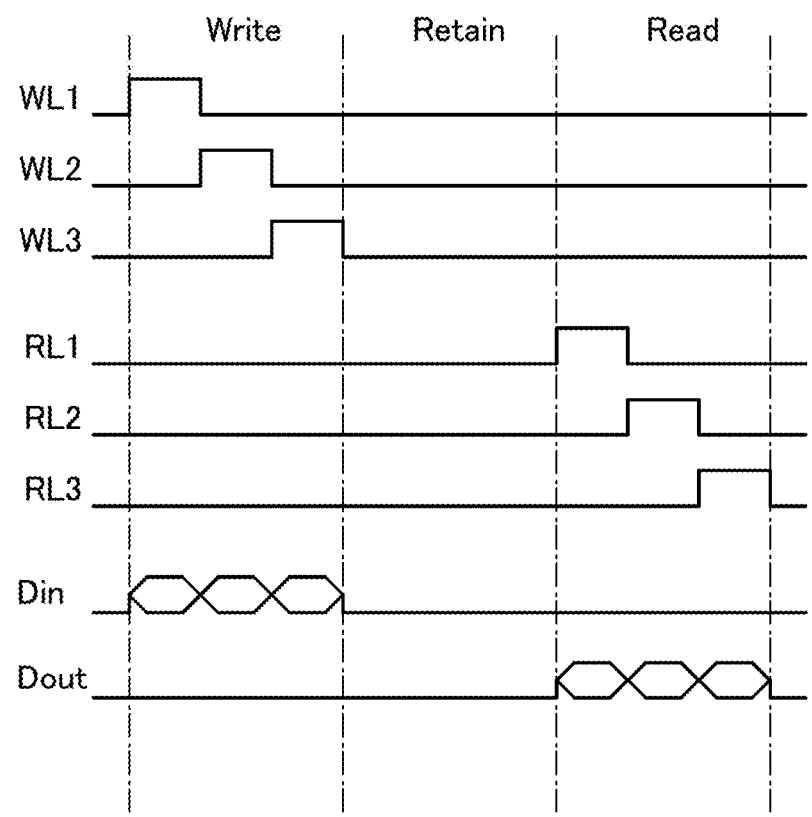
FIG. 4 illustrates Embodiment 2.

Next, an operation of a memory device according to one embodiment of the present invention is described using FIG. 4 giving the cell array in FIG. 3 as an example. FIG. 4 is a timing chart illustrating a change in the potentials of signals input to the wirings over time in the case where the first transistor 101A, 101B, 101C and the second transistor 102A, 102B, 102C are n-channel transistors and binary data is handled.

First, an operation of the memory device in data writing is described. In writing data, a signal with a pulse is input to the writing word line WL1, so that the potential of the pulse, specifically, a high-level potential, is supplied to the gate electrode of the first transistor 101A, whose gate electrode is connected to the writing word line WL1, to turn on the first transistor 101A. In the meantime, the reading word line RL1 is supplied with the potential so as to set the threshold voltage of the second transistor 102A to $Vth_0$ as described in FIGS. 2A and 2B, so that the second transistor 102A whose third gate electrode is connected to the reading word line RL1 is kept off.

Then, a signal containing data is input to the input data line Din. FIG. 4 illustrates the case where a signal with a high- or low-level potential is input to the input data line Din. Further, in the case where binary data is handled, the potential levels of a signal input to the input data line Din are two levels corresponding to power supply voltages (e.g., Vdd and Vss). In the case where multivalued data with three or more values is handled, the numbers of the potential levels may be determined on the basis of a cardinal number used in the data.

The potential input to the input data line Din is supplied to the second gate electrode of the second transistor 102A through the first transistor 101A. Then, in accordance with the potential of the second gate electrode, the second transistor 102A is turned on or off at the threshold voltage of the second transistor 102A of $Vth_0$.

Upon termination of the input of the signal with the pulse to the writing word line WL1, the first transistor 101A whose gate electrode is connected to the writing word line WL1 is turned off. Then, signals with pulses are sequentially input to the writing word line WL2 and the writing word line WL3, and the above operation is similarly performed sequentially in the memory cell connected to the writing word line WL2 and the memory cell connected to the writing word line WL3.

Next, an operation of the memory device in data retention is described. In data retention, all of the writing word lines WL1 to WL3 are supplied with a potential with a level at which the first transistor 101A, 101B, 101C is turned off, specifically, a low-level potential. Since the off-state current of the first transistor 101A, 101B, 1010 is extremely low as described above, the level of the potential of the second gate electrode set in the data writing is retained. In addition, since the reading word line RL1, RL2, RL3 is supplied with the potential so as to set the threshold voltage of the second transistor 102A, 102B, 102C to $Vth_0$ as described in FIGS. 2A and 2B, the second transistor 102A, 102B, 102C whose third gate electrode is connected to the reading word line RL1, RL2, RL3 is kept off.

In the timing chart of FIG. 4, a retention period is provided in order to describe the operation of data retention. However, a retention period is not necessarily provided in an operation of a memory.

Next, an operation of the memory device in data reading is described. In data reading, as in the data retention, all of the writing word lines WL1 to WL3 are supplied with the potential with the level at which the first transistor 101A, 101B, 101C is turned off, specifically, the low-level potential.

On the other hand, in data reading, a signal with a pulse is sequentially input to the reading word lines RL1 to RL3. Specifically, first, the signal with a pulse is input to the reading word line RL1, whereby the potential of the pulse, specifically, a potential at which the threshold voltage of the second transistor 102A is $Vth_1$ is input as shown in FIGS. 2A and 2B. In the second transistor 102A, the threshold voltage is shifted to $Vth_1$, and the drain current or the resistance value between the source electrode and the drain electrode is determined in accordance with the potential the second gate electrode written in the data writing.

Then, a potential containing as data the drain current or the resistance value between the source electrode and the drain electrode of the second transistor 102A, i.e., the potential of the drain electrode of the second transistor 102A is supplied to a driver through the output data line Dout.

The level of the potential supplied to the output data line Dout is determined in accordance with data written to the memory cell. Accordingly, in an ideal view, the potentials supplied to the output data lines Dout connected to the memory cells are the same level when data with the same value is stored in each of the plurality of memory cells. However, practically, there is a case where the characteristics of the first transistors 101A to 101C or the second transistors 102A to 102C are varied among the memory cells. In that case, the potentials which are supplied to the output data lines Dout are varied even if all of data to be read has the same value, bringing a range of distribution of the potentials. Therefore, as the driver, a reading circuit in which a signal containing correct data with an amplitude and an waveform processed in accordance with specifications can be generated even in the case where a little variation occurs in the potentials supplied to the output data lines Dout is provided for the memory device.

Although in Embodiment 2, a driving method in which writing, retaining, and reading of data are sequentially performed in a plurality of memory cells is described, one embodiment of the present invention is not limited to this structure. The above operation may be performed on a memory cell in a specified address.

Figure 5:
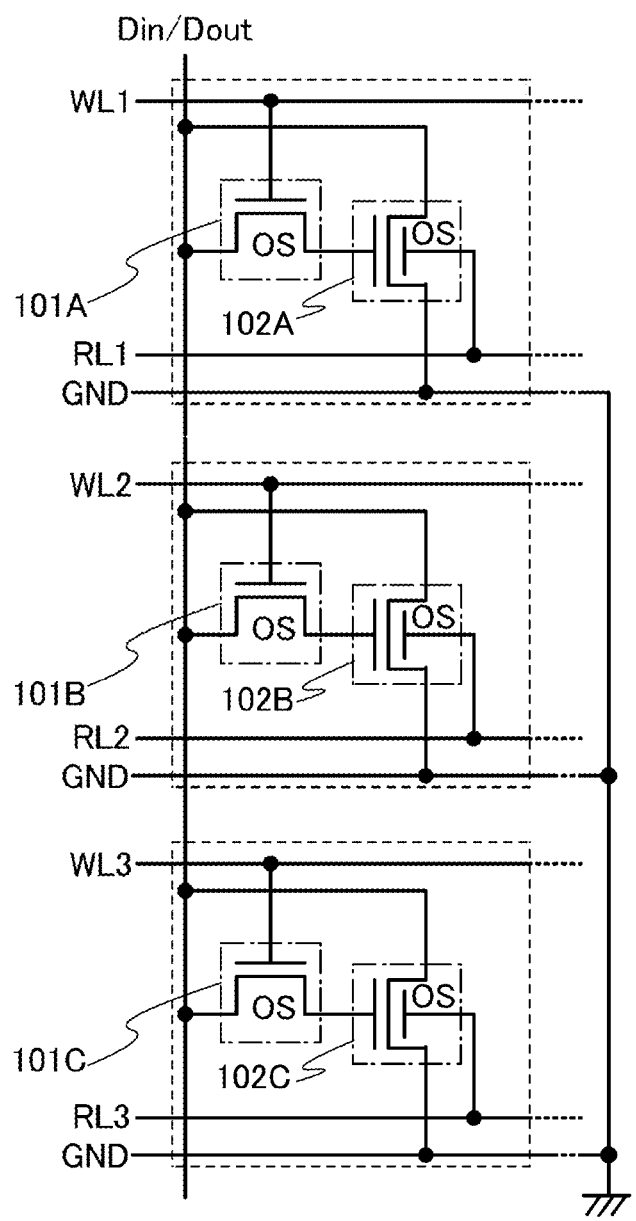
FIG. 5 illustrates Embodiment 2.

According to the structure of this embodiment, written data can be retained for a while. The input data line Din and the output data lines Dout in the circuit diagram of FIG. 3 can be formed as a common wiring. A specific circuit diagram thereof is shown in FIG. 5. With the structure shown in FIG. 5, the number of wirings can be reduced, leading to higher density of memory cells.

This embodiment can be implemented in appropriate combination with any structure described in the other embodiments.

Embodiment 3

Figure 6A:
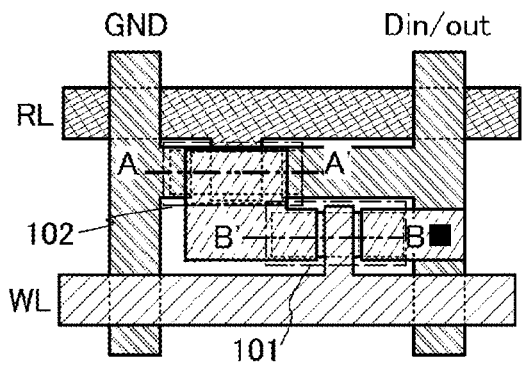
FIGS. 6A to 6C illustrate Embodiment 3.
Figure 6B:
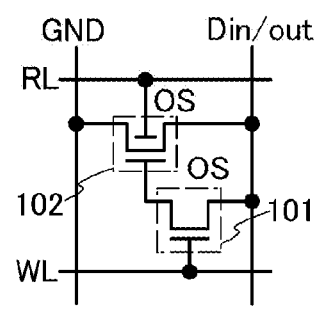
Figure 6C:
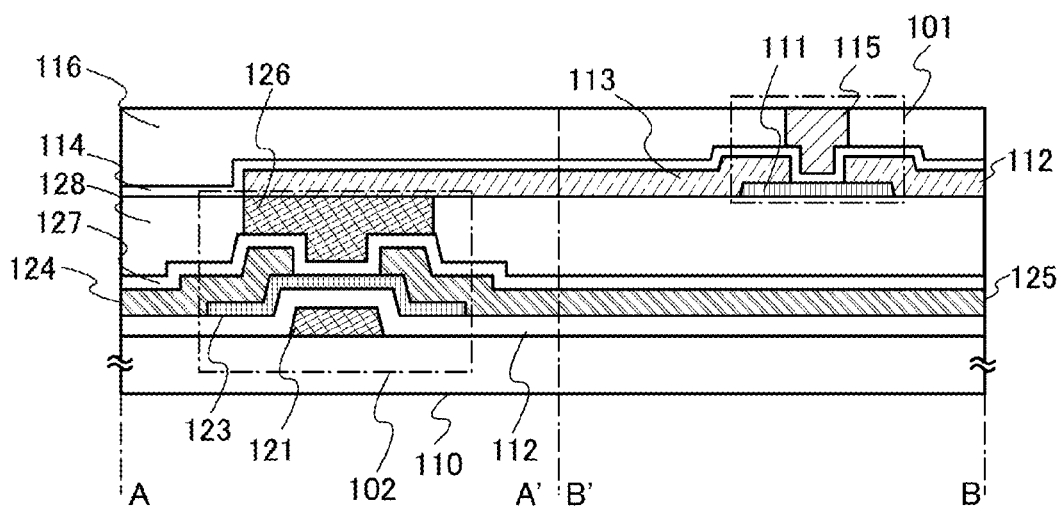

In this embodiment, a top view, a circuit diagram, and a cross-sectional view of a memory cell in a memory device are described using FIGS. 6A to 6C.

FIG. 6A is a plane view of the memory cell. FIG. 6B is a circuit diagram corresponding to the plane view of FIG. 6A. FIG. 6C is a cross-sectional view along A-A' and B-B' in FIG. 6A. Common reference symbols are used in FIGS. 6A to 6C and FIGS. 1A and 1B for showing arrangement of the first transistor 101 and the second transistor 102. In FIGS. 6A to 6C, one line serves both as an input data line and an output data line.

In FIGS. 6A and 6C, in particular, the first gate electrode of the first transistor 101 and the second gate electrode and the third gate electrode of the second transistor 102 are illustrated with sizes different from each other.

Specifically, it is preferable to satisfy S3<S2 where the area of part of the second gate electrode which overlaps with the active layer including the second channel formation region is S2 and the area of part of the third gate electrode which overlaps with the active layer including the second channel formation region is S3. In particular, by increasing the area S2, the capability of retaining electric charge in the second gate electrode can be enhanced.

Further, it is preferable to satisfy S1<S3<S2 where the area of part of the first gate electrode which overlaps with the active layer including the first channel formation region is S1. In particular, by decreasing the area S1, the parasitic capacitance of the writing word line WL can be reduced, by which power consumption of charge; discharge can be reduced.

This embodiment can be implemented in appropriate combination with any structure described in the other embodiments.

Embodiment 4

In this embodiment, an example of a structure of a transistor which can be used in the memory device of the above embodiment is described. In particular, an example of a structure and an example of a manufacturing process in the case of miniaturizing the first transistor 101 in the structure described in the above embodiment are described in this embodiment.

In particular, as an example of the structure of the first transistor, a structure in which a source and drain regions in the active layer including an oxide semiconductor in its channel formation region are formed by adding an impurity into the oxide semiconductor such that the resistance of the source and drain regions is lower than that of the channel formation region is described in this embodiment. The resistance of the impurity region is lower than that of the channel formation region.

FIGS. 7A to 7D are cross-sectional views of a transistor, which are structures of the first transistor 101 in this embodiment. The transistor structures shown in FIGS. 7A to 7D are top-gate structures. Such a top-gate structure of the first transistor 101 in which a source and drain regions are formed in a self-aligned manner using a gate electrode as shown in FIGS. 7A to 7D leads to miniaturization of the transistor. Accordingly, there is no overlap between the gate electrode of the transistor and the source or drain electrode, so that the parasitic capacitance between the first transistor and the writing word line WL can be reduced. Consequently, power consumption of charge/discharge can be reduced.

Figure 7A:
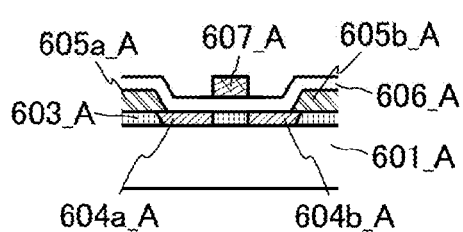
FIGS. 7A to 7D illustrate Embodiment 4.

A transistor shown in FIG. 7A includes a semiconductor layer 603_A, a conductive layer 605a_A, a conductive layer 605b_A, an insulating layer 606_A, and a conductive layer 607_A.

The semiconductor layer 603_A includes a high-concentration region 604a_A and a high-concentration region 604b_A with a space provided therebetween. The region between the high-concentration region 604a_A and the high-concentration region 604b_A is a channel formation region. The semiconductor layer 603_A is provided, for example, over an insulating layer 601_A. The high-concentration region refers to a region whose resistance is decreased by a dopant added at a high concentration, and a low-concentration region refers to a region whose resistance is decreased by a dopant added at a low concentration.

The conductive layer 605a_A and the conductive layer 605b_A are provided over the semiconductor layer 603_A to be electrically connected to the semiconductor layer 603_A. For example, the conductive layer 605a_A and the conductive layer 605b_A are in contact with part of the semiconductor layer 603_A. Further, each side surface of the conductive layer 605a_A and the conductive layer 605b_A is tapered to overlap with part of the high-concentration region 604a_A and part of the high-concentration region 604b_A, respectively.

The insulating layer 606_A is provided over the semiconductor layer 603_A, the conductive layer 605a_A, and the conductive layer 605b_A.

The conductive layer 607_A overlaps with part of the semiconductor layer 603_A between the high-concentration region 604a_A and the high-concentration region 604b_A, with the insulating layer 606_A provided therebetween. The part of the semiconductor layer 603_A which overlaps with the conductive layer 607_A with the insulating layer 606_A provided therebetween is the channel formation region.

Figure 7B:
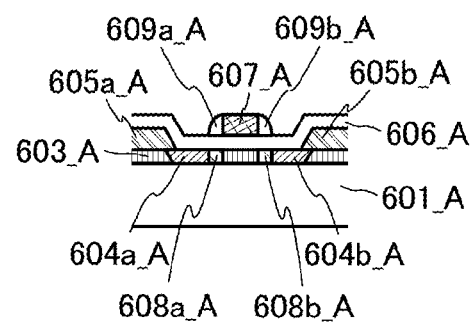

A transistor shown in FIG. 7B includes an insulating layer 609a_A and an insulating layer 609b_A which are sidewalls in addition to the structure shown in FIG. 7A, and further includes a low-concentration region 608a_A and a low-concentration region 608b_A between the high-concentration region 604a_A and the high-concentration region 604b_A in the semiconductor layer 603_A.

The insulating layer 609a_A and the insulating layer 609b_A are provided over the insulating layer 606_A and in contact with the sides of the conductive layer 607_A, which are opposite to each other.

The low-concentration region 608a_A and the low-concentration region 608b_A overlap with the insulating layer 609a_A and the insulating layer 609b_A, respectively, with the insulating layer 606_A provided therebetween. The impurity concentration of the low-concentration region 608a_A, 608b_A is lower than that of the high-concentration region 604a_A, 604b_A.

With the low-concentration region 608a_A, 608b_A, local electric-field concentration on the transistor can be suppressed, increasing the reliability of the transistor.

Figure 7C:
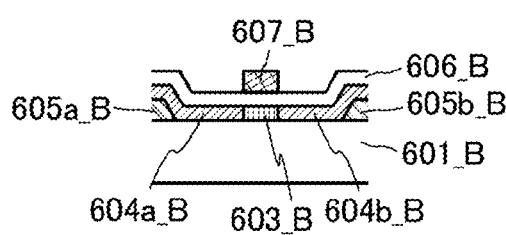

A transistor shown in FIG. 7C includes a semiconductor layer 603_B, a conductive layer 605a_B, a conductive layer 605b_B, an insulating layer 606_B, and a conductive layer 607_B.

The conductive layer 605a_B and the conductive layer 605b_B are provided over an insulating layer 601_B and are electrically connected to a high-concentration region 604a_B and a high-concentration region 604b_B, respectively. For example, the conductive layer 605a_B and the conductive layer 605b_B are in contact with part of the high-concentration region 604a_B and part of the high-concentration region 604b_B, respectively. Further, each side surface of the conductive layer 605a_B and the conductive layer 605b_B is tapered to overlap with part of the high-concentration region 604a_B and part of the high-concentration region 604b_B respectively.

The semiconductor layer 603_B is provided between the high-concentration region 604a_B and the high-concentration region 604b_B. The semiconductor layer 603_B forms a channel formation region. The semiconductor layer 603_B may be provided over the conductive layer 605a_A, the conductive layer 605b_A, and the insulating layer 601_B, for example.

The insulating layer 606_B is provided over the semiconductor layer 603_B, the high-concentration region 604a_B, and the high-concentration region 604b_B.

The conductive layer 607_B overlaps with part of the semiconductor layer 603_B with the insulating layer 606_B provided therebetween. The part of the semiconductor layer 603_B which overlaps with the conductive layer 607_B with the insulating layer 606_B provided therebetween is the channel formation region.

Figure 7D:
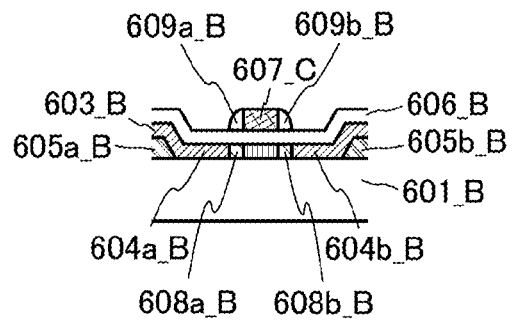

A transistor shown in FIG. 7D includes an insulating layer 609a_B and an insulating layer 609b_B which are sidewalls in addition to the structure shown in FIG. 7C, and further includes a low-concentration region 608a_B and a low-concentration region 608b_B between the high-concentration region 604a_B and the high-concentration region 604b_B in the semiconductor layer 603_B.

The insulating layer 609a_B and the insulating layer 609b_B are provided over the insulating layer 606_B and in contact with the sides which are opposite to each other of the conductive layer 607_B.

The low-concentration region 608a_B and the low-concentration region 608b_B overlap with the insulating layer 609a_B and the insulating layer 609b_B, respectively with the insulating layer 606_B provided therebetween. The impurity concentration of the low-concentration region 608a_B, 608b_B is lower than that of the high-concentration region 604a_B, 604b_B.

With the low-concentration region 608a_B, 608b_B, local electric-field concentration on the transistor can be suppressed, increasing the reliability of the transistor.

Further, the components shown in FIGS. 7A to 7D are described below.

As any of the insulating layers 601_A and 601_B, a single layer or a stacked layer of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and/or a hafnium oxide layer can be used, for example. It is preferable that the insulating layers 601_A and 601_B be formed using a material whose surface can be processed to be flat.

The semiconductor layer 603_A and the oxide semiconductor layer 603_B each function as a channel formation layer of the transistor. As any of the semiconductor layers 603_A and 603_B, an oxide semiconductor layer containing a four-component metal oxide, a three-component metal oxide, a two-component metal oxide, or the like can be used, for example.

As the four-component metal oxide, an In—Sn—Ga—Zn—O-based metal oxide or the like can be used, for example.

As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be used, for example.

As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or an In—Ga—O-based metal oxide can be used, for example.

Further, as any of the semiconductor layers 603_A and 603_B, an In—O-based metal oxide, a Sn—O-based metal oxide, or a Zn—O-based metal oxide can be used, for example. Further, the metal oxide that can be used as the oxide semiconductor may contain silicon oxide. Further, the metal oxide that can be used as the oxide semiconductor may contain nitrogen.

As any of the semiconductor layers 603_A and 603_B, a material represented by $InLO_3(ZnO)_m$ (m is larger than 0) can be used, where L in $InLO_3(ZnO)_m$ represents one or more metal elements selected from Ga, Al, Mn, and Co.

The high-concentration regions 604a_A and 604a_B each function as a source or a drain of the transistor. A region functioning as a source of a transistor is also referred to as a source region, and a region functioning as a drain of a transistor is also referred to as a drain region.

The resistance of the low-concentration region 608a_A, 608b_A, 608a_B, 608b_B is higher than that of the high-concentration region 604a_A, 604b_A, 604a_B, 604b_B; thus, the low-concentration region 608a_A, 608b_A, 608a_B, 608b_B is also referred to as a high-resistance impurity region.

As the dopant added into the high-concentration region 604a_A, 604b_A, 604a_B, 604b_B and the low-concentration region 608a_A, 608b_A, 608a_B, 608b_B, one or more of nitrogen, phosphorus, arsenic, argon, xenon, helium, and hydrogen can be used, for example.

It is preferable that the concentration of the dopant in the high-concentration region 604a_A, 604b_A, 604a_B, 604b_B be greater than or equal to, for example, $5\times10^{19}$ cm$^{-3}$.

It is preferable that the concentration of the dopant in the low-concentration region 608a_A, 608b_A, 608a_B, 608b_B be, for example, greater than or equal to $5\times10^{18}$ cm$^{-3}$ and less than $5\times10^{19}$ cm$^{-3}$.

The crystallinity of the high-concentration region 604a_A, 604b_A, 604a_B, 604b_B and the crystallinity of the low-concentration region 608a_A, 608b_A, 608a_B, 608b_B may be lower than that of the channel formation region.

The high-concentration region 604a_A, 604b_A, 604a_B, 604b_B and the low-concentration region 608a_A, 608b_A, 608a_B, 608b_B may contain a crystal with a wurtzite structure which is an In—Ga—Zn—O—N-based material. In that case, such a wurtzite structure is more likely to be formed in the case where the content of nitrogen in the high-concentration region 604a_A, 604b_A, 604a_B, 604b_B or the low-concentration region 608a_A, 608b_A, 608a_B, 608b_B is greater than or equal to $1\times10^{20}$ cm$^{-3}$ and less than 7 atomic %.

With such a structure in which the impurity region contains a crystal with a wurtzite structure which is an In—Ga—Zn—O—N-based material, the resistance between the channel formation region and the source or drain of the transistor can be reduced.

The conductive layer 605a_A, 605b_A, 605a_B, 605b_B functions as the source or drain of the transistor. A layer functioning as a source of a transistor can also be referred to as a source electrode or a source wiring, and a layer functioning as a drain of a transistor can also be referred to as a drain electrode or a drain wiring.

A layer of a metal material such as aluminum, chromium, copper, tantalum, titanium, molybdenum, or tungsten; or an alloy material which contains any of the above metal materials as a main component can be used as any of the conductive layers 605a_A, 605b_A, 605a_B, and 605b_B, for example. As the layer of the alloy material, a layer of a Cu—Mg—Al alloy material can be used, for example.

A layer containing a conductive metal oxide can also be used as the conductive layer 605a_A, 605b_A, 605a_B, 605b_B. The conductive metal oxide may contain silicon oxide.

Further, a layer of an In—Ga—Zn—O—N-based material can also be used as the conductive layer 605a_A, 605b_A, 605a_B, 605b_B, which is preferable because the electrical conductivity of the layer of the In—Ga—Zn—O—N-based material is high.

Further, a plurality of layers of a material/materials applicable to the conductive layer 605a_A, 605b_A, 605a_B, 605b_B can be stacked to form the conductive layer 605a_A, 605b_A, 605a_B, 605b_B. For example, the conductive layer 605a_A, 605b_A, 605a_B, 605b_B can be formed of a stack of a layer of a Cu—Mg—Al alloy material and a copper layer thereon, whereby the adhesion to the insulating layer which is in contact with the conductive layer 605a_A, 605b_A, 605a_B, 605b_B can be increased.

As the insulating layer 606_A, 606_B, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. A plurality of layers of a material/materials applicable to the insulating layer 606_A, 606_B can be stacked to form the insulating layer 606_A, 606_B.

As the insulating layer 606_A, 606_B, an insulating layer of a material containing, for example, an element that belongs to Group 13 in the periodic table and oxygen can also be used.

Examples of the material containing an element that belongs to Group 13 and oxygen include gallium oxide, aluminum oxide, aluminum gallium oxide, and gallium aluminum oxide. Aluminum gallium oxide refers to a substance in which the amount of aluminum is larger than that of gallium in atomic percent, and gallium aluminum oxide refers to a substance in which the amount of gallium is larger than or equal to that of aluminum in atomic percent.

The conductive layers 607_A and 607_B each function as a gate of a field-effect transistor. Such a conductive layer functioning as a gate of a field-effect transistor can also be referred to as a gate electrode or a gate wiring.

As the conductive layer 607_A, 607_B, a layer of a metal material such as aluminum, chromium, copper, tantalum, titanium, molybdenum, or tungsten; or an alloy material containing the metal material as a main component can be used, for example. A plurality of layers of a material/materials applicable to the conductive layer 607_A, 607_B can be stacked to form the conductive layer 607_A, 607_B.

A layer containing a conductive metal oxide can also be used as the conductive layer 607_A, 607_B. The conductive metal oxide may contain silicon oxide. The conductive metal oxide may contain nitrogen; the electrical conductivity can be improved by nitrogen.

Further, a layer of an In—Ga—Zn—O—N-based material can also be used as the conductive layer 607_A, 607_B, which is preferable because the electrical conductivity of the layer of the In—Ga—Zn—O—N-based material is high.

A layer of a material applicable to the insulating layer 606_A, 606_B can be used as the insulating layer 609a_A, 609b_A, 609a_B, 609b_B, for example. Further, a plurality of layers of a material/materials applicable to the insulating layer 609a_A, 609b_A, 609a_B, 609b_B can be stacked to form the insulating layer 609a_A, 609b_A, 609a_B, 609b_B.

Next, as an example of a method for manufacturing the transistor in this embodiment, an example of a method for manufacturing the transistor illustrated in FIG. 7A is described with reference to FIGS. 8A to 8E. FIGS. 8A to 8E are cross-sectional views for describing the example of the method for forming the transistor in this embodiment.

Figure 8A:
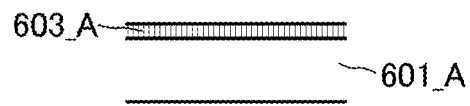
FIGS. 8A to 8E illustrate Embodiment 4.

First, as shown in FIG. 8A, the semiconductor layer 603_A is formed over the insulating layer 601_A serving as a first insulating layer.

An example of a method for forming an oxide semiconductor layer with crystallinity improved as one example of the semiconductor layer 603_A is described below.

The method for forming the oxide semiconductor layer includes a step of forming a semiconductor film over the insulating layer 601_A and a step of performing heat treatment at least one time. The example of the method for forming the semiconductor layer 603_A may include a step of removing part of the semiconductor film; when to perform that step is not particularly limited as long as it is in the period between formation of the semiconductor film and formation of the conductive layer 605a_A, 605b_A. Further, when to perform the heat treatment is not particularly limited as long as it is after formation of the semiconductor film.

In the step of forming a semiconductor film over the insulating layer 601_A, for example, the semiconductor film is formed by forming a layer of a material applicable to the semiconductor layer 603_A by a sputtering method. In that step, the temperature on the film formation side (substrate side) is set to higher than or equal to 100° C. and lower than or equal to 500° C.

In the step of performing heat treatment, for example, heat treatment at a temperature higher than or equal to 400° C. and lower than or equal to 750° C. (also called heat treatment A) is performed. The timing of the heat treatment A is not particularly limited as long as it is after formation of the semiconductor film.

The heat treatment A causes crystallization from a top surface of the semiconductor film; crystal growth proceeds from the top surface toward the inside of the semiconductor film.

Through the above process, a semiconductor film (CAAC-OS: C Axis Aligned Crystalline Oxide semiconductor) which is non-single-crystal and has atoms arranged in a triangular, hexagonal, equilateral triangular, or regular hexagonal shape when seen from a direction perpendicular to an a-b plane and has a phase in which metal atoms are arranged in layers in the c-axis direction or a phase in which metal atoms and oxygen atoms are arranged in layers in the c-axis direction can be formed.

As a heat treatment apparatus for the heat treatment A, an electric furnace or an apparatus for heating an object by heat conduction or heat radiation from a heating element such as a resistance heating element; for example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

In addition, after the heat treatment A, a high-purity oxygen gas, a high-purity $N_2O$ gas, or ultra-dry air (with a dew point of −40° C. or lower, preferably −60° C. or lower) may be introduced into the furnace used in the above heat treatment A. It is preferable that the oxygen gas or the $N_2O$ gas do not contain water, hydrogen, and the like. The purity of the oxygen gas or the $N_2O$ gas which is introduced into the heat treatment apparatus is preferably greater than or equal to 6N, further preferably greater than or equal to 7N (i.e., the impurity concentration of the oxygen gas or the $N_2O$ gas is preferably less than or equal to 1 ppm, further preferably less than or equal to 0.1 ppm). The oxygen gas or the $N_2O$ gas acts to supply oxygen to the semiconductor layer 603_A, so that defects caused by oxygen deficiency in the semiconductor layer 603_A can be reduced.

Figure 8B:
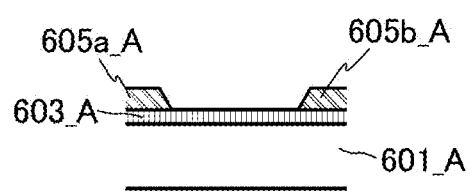

Next, as shown in FIG. 8B, a first conductive film is formed over part of the semiconductor layer 603_A and is etched to form the conductive layers 605a_A and 605b_A.

For example, the first conductive film can be formed by forming a layer of a material applicable to the conductive layer 605a_A, 605b_A by a sputtering method or the like. A plurality of films of a material/materials applicable to the conductive layer 605a_A, 605b_A may be stacked to form the first conductive film.

As is in the method for forming the conductive layers 605a_A and 605b_A, in the case of etching a film in the example of the method for forming the transistor of this embodiment, for example, a resist mask may be formed over part of the film by a photolithography process and the resist mask may be etched using the resist mask. In that case, the resist mask is preferably removed after the etching.

Figure 8C:
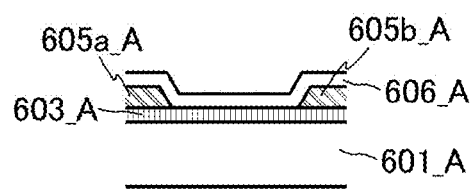

Next, as shown in FIG. 8C, a second insulating film is formed over the semiconductor layer 603_A and the conductive layers 605a_A and 605b_A to form the insulating layer 606_A.

For example, the second insulating film can be formed by forming a film of a material applicable to the insulating layer 606_A by a sputtering method, a plasma-enhanced CVD method, or the like. A plurality of films of a material/materials applicable to the insulating layer 606_A may be stacked to form the second insulating film. Further, the insulating layer 606_A can also be formed by forming a film of a material applicable to the insulating layer 606_A by a high-density plasma-enhanced CVD method (e.g., a high-density plasma-enhanced CVD method using microwaves (e.g., microwaves with a frequency of 2.45 GHz)); in that case, the film density of the insulating layer 606_A becomes high, leading to improvement in the withstand voltage of the insulating layer 606_A.

Figure 8D:
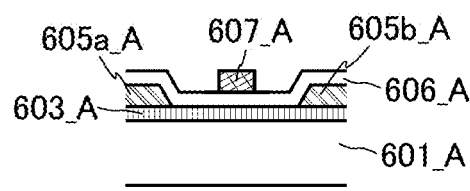

Next, as shown in FIG. 8D, a second conductive film is formed over the insulating layer 606_A and is etched to form the conductive layer 607_A.

For example, the second conductive film can be formed by forming a film of a material applicable to the conductive layer 607_A by a sputtering method. A plurality of films of a material/materials applicable to the second conductive film may be stacked to form the second conductive film.

A high-purity gas from which impurities such as hydrogen, water, a hydroxyl group, or a hydride are removed can be used as a sputtering gas, so that the impurity concentration of the film becomes low.

Before the film is formed by a sputtering method, heat treatment may be performed in a heat chamber of a sputtering apparatus (the heat treatment is also called heat treatment B). With the heat treatment B, an impurity such as hydrogen and moisture can be eliminated.

Before the film is formed by a sputtering method, for example, treatment (also called reverse sputtering) by which voltage is applied to a film formation side, not to a target side, in an argon, nitrogen, helium, or oxygen atmosphere with the use of an RF power and plasma is generated so that a surface on which the film is formed is modified may be performed. With reverse sputtering, powdery substances (also called particles or dust) attached to the surface on which the film is formed can be removed.

In the case where the film is formed by a sputtering film, moisture remaining in a deposition chamber used for forming the film can be removed with an entrapment vacuum pump or the like. As the entrapment vacuum pump, a cryopump, an ion pump, or a titanium sublimation pump can be used, for example. Moisture remaining in the deposition chamber can also be removed with a turbo pump provided with a cold trap.

In addition, after the insulating layer 606_A is formed, heat treatment may be performed in an inert gas atmosphere or an oxygen gas atmosphere (the heat treatment also called heat treatment C). The heat treatment C can be performed at a temperature, for example, higher than or equal to 200° C. and lower than or equal to 400° C., preferably higher than or equal to 250° C. and lower than or equal to 350° C.

In this manner, the semiconductor layer 603_A can be purified.

Figure 8E:
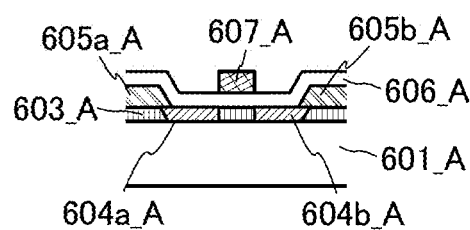

Next, as shown in FIG. 8E, a dopant is added into the semiconductor layer 603_A, so that the high-concentration regions 604a_A and 604b_A are formed.

For example, the dopant can be added with the use of an ion doping apparatus or an ion implantation apparatus.

As the dopant, one or more of nitrogen, phosphorus, arsenic, argon, xenon, helium, and hydrogen can be used, for example.

Heat treatment may be performed after the dopant is added into the semiconductor layer 603_A.

The above is an example of the method for manufacturing the transistor illustrated in FIG. 7A.

In this embodiment, the top-gate structure of the first transistor 101 in which a source and drain regions are formed in a self-aligned manner using a gate electrode leads to miniaturization of the transistor. Accordingly, there is no overlap between the gate electrode of the transistor and the source or drain electrode, so that the parasitic capacitance between the first transistor and the writing word line WL can be reduced. Consequently, power consumption of charge/discharge can be reduced.

The following method has been disclosed as a structure, which is different from this embodiment, of a method for forming a source and drain regions in a transistor using an oxide semiconductor in a self-aligned manner part of a top surface of an oxide semiconductor film is exposed, on which argon plasma treatment is performed to reduce the resistance of the part (S. Jeon et al. "180 nm Gate Length Amorphous InGaZnO Thin Film Transistor for High Density Image Sensor Application", *IEDM Tech. Dig.*, p. 504, 2010).

However, according to the above method, in order to expose part serving as the source or drain region, it is necessary to remove part of an insulating layer formed as a gate insulating film. When the part of the gate insulating film is removed, part of the underlying oxide semiconductor film is also etched, so that the thickness of the part serving as the source or drain region is decreased. Consequently, the resistance of the source or drain region is increased, and defects in characteristics of the transistor due to over-etching tends to be triggered.

For further miniaturization of a transistor, it is suitable to adopt a dry-etching method with high process accuracy. However, the above-described over-etching remarkably tends to occur in the dry-etching method by which the selection ratio of the gate insulating film to the oxide semiconductor film cannot be sufficiently provided.

For example, although over-etching does not matter when the oxide semiconductor film is sufficiently thick, it is necessary that the thickness of part of the oxide semiconductor film which serves as a channel formation region is less than or equal to 20 nm, preferably less than or equal to 10 nm when the channel length is less than or equal to 200 nm, considering prevention of a short-channel effect. Over-etching of such a thin oxide semiconductor film is not preferable because the above-described problem such as increase in the resistance of the source or drain region or a defect in characteristics of the transistor occurs.

However, such over-etching of an oxide semiconductor film can be prevented by adding a dopant into the oxide semiconductor film while remaining the insulating layer not to expose the oxide semiconductor film, as is in the structure of this embodiment, so that the oxide semiconductor film can be prevented from being excessively damaged. In that case also, the interface between the oxide semiconductor film and the gate insulating film can be kept clean. Accordingly, the characteristics and reliability of the transistor can be improved.

This embodiment can be implemented in appropriate combination with any structure described in the other embodiments.

Embodiment 5

An oxide semiconductor preferably contains at least indium (In) or zinc (Zn); in particular, In and Zn are preferably contained.

In addition, as a stabilizer for reducing the variation in electrical characteristics of a transistor including the oxide semiconductor, one or more elements selected from gallium (Ga), tin (Sn), hafnium (Hf), aluminum (Al), and lanthanoid in addition to In and Zn is/are preferably included.

As lanthanoid, the following can be used: lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As a single-component metal oxide included in the oxide semiconductor, for example, an indium oxide, a tin oxide, a zinc oxide, or the like can be used.

As a two-component metal oxide included in the oxide semiconductor, for example, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, or the like can be used.

As a three-component metal oxide included in the oxide semiconductor, for example, an In—Ga—Zn-based oxide (also referred to as IGZO), an In—Sn—Zn-based oxide (also referred to as ITZO), a Sn—Ga—Zn-based oxide, an In—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an Al—Ga—Zn-based oxide, a Sn—Al—Zn-based oxide, or the like can be used.

As a four-component metal oxide included in the oxide semiconductor, for example, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used.

In this specification, for example, the "In—Ga—Zn-based oxide" refers to an oxide containing In, Ga, and Zn as its main components and there is no particular limitation on the ratio of In:Ga:Zn. The In—Ga—Zn-based oxide may further contain another metal element.

For example, an In—Ga—Zn-based oxide with an atomic ratio of In:Ga:Zn=1:1:1 ($=1/3:1/3:1/3$) or In:Ga:Zn=2:2:1 ($=2/5:2/5:1/5$), or an oxide with an atomic ratio close to any of the atomic ratios can be used.

Alternatively, an In—Sn—Zn-based oxide with an atomic ratio of In:Sn:Zn=1:1:1 ($=1/3:1/3:1/3$), In:Sn:Zn=2:1:3 ($=1/3:1/6:1/2$), or In:Sn:Zn=2:1:5 ($=1/4:1/8:5/8$), or an oxide with an atomic ratio close to any of the atomic ratios may be used.

However, one embodiment of the present invention is not limited thereto; any material with an appropriate composition can be used considering semiconductor characteristics of the transistor (e.g., mobility, threshold voltage, and variation). In addition, considering the semiconductor characteristics, it is preferable that the carrier density the impurity concentration, the defect density, the atomic ratio between a metal element and oxygen, the interatomic distance, the density, and the like be set to appropriate values.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Since an amorphous structure has many defects, a non-amorphous structure is preferable.

This embodiment can be implemented in appropriate combination with any structure described in the other embodiments.

Embodiment 6

An oxide semiconductor which has a non-crystalline portion and a crystalline portion having the c-axis alignment, CAAC-OS is described.

The CAAC-OS is a new oxide semiconductor. The CAAC-OS has a c-axis alignment and a triangular or hexagonal atomic arrangement when seen from the direction of a a-b plane, a top surface, or an interface.

In the CAAC-OS, metal atoms are arranged in a layered manner, or metal atoms and oxygen atoms are arranged in a layered manner in the c-axis direction.

Further, in the CAAC-OS, an a-axis direction or a b-axis direction varies in the a-b plane (a rotation structure around the c-axis).

The CAAC-OS is a non-single-crystal in a broad sense.

The CAAC-OS has a triangular, hexagonal, regular triangular, or regular hexagonal atomic arrangement when seen from the direction perpendicular to the a-b plane.

In addition, the CAAC-OS is an oxide having a phase where metal atoms are arranged in a layered manner or metal atoms and oxygen atoms are arranged in a layered manner when seen from the direction perpendicular to the c-axis direction.

The CAAC-OS is not a single crystal, but does not consist only of an amorphous portion.

Although the CAAC-OS includes a crystallized portion (crystalline portion), a boundary between one crystalline portion and another crystalline portion is not clear in some cases.

Nitrogen may be substituted for part of oxygen which is a constituent of the CAAC-OS.

The c-axes of the crystalline portions included in the CAAC-OS may be aligned in one direction (e.g., a direction perpendicular to a surface of a substrate over which the CAAC-OS is formed or a top surface of the CAAC-OS).

The normals of the a-b planes of the crystalline portions included in the CAAC-OS may be aligned in one direction (e.g., a direction perpendicular to a surface of a substrate over which the CAAC-OS is formed or a top surface of the CAAC-OS).

The CAAC-OS is a conductor, a semiconductor, or an insulator, which depends on its composition or the like. The CAAC-OS transmits or does not transmit visible light, which depends on its composition or the like.

For example, the CAAC-OS which is formed into a film shape has a triangular or hexagonal atomic arrangement when observed from the direction perpendicular to a top surface of the film or a surface of a supporting substrate with an electron microscope.

Further, when the cross section of the film is observed by an electron microscope, metal atoms are arranged in a layered manner or metal atoms and oxygen atoms (or nitrogen atoms) are arranged in a layered manner.

Examples of a crystal structure of the CAAC-OS are described with reference to FIGS. 16A to 16E, FIGS. 17A to 17C, and FIGS. 18A to 18C.

In FIGS. 16A to 16E, FIGS. 17A to 17C, and FIGS. 18A to 18C, the vertical direction corresponds to the c-axis direction and a plane perpendicular to the c-axis direction corresponds to the a-b plane.

In this embodiment, an "upper half" and a "lower half" refer to an upper half above the a-b plane and a lower half below the a-b plane (an upper half and a lower half with respect to the a-b plane).

Figure 16A:
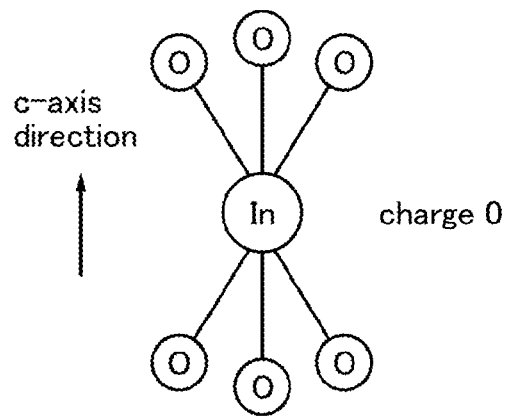
FIGS. 16A to 16E illustrate examples of an oxide semiconductor.

FIG. 16A illustrates a structure A including one hexacoordinate In atom and six tetracoordinate oxygen (hereinafter referred to as tetracoordinate O) atoms proximate to the In atom.

In this specification, a structure showing only oxygen atoms proximate to one metal atom is referred to as a small group.

The structure A is actually an octahedral structure, but is illustrated as a planar structure for simplicity.

Three tetracoordinate O atoms exist in each of the upper half and the lower half in the structure A. The electric charge of the small group illustrated in the structure A is 0.

Figure 16D:
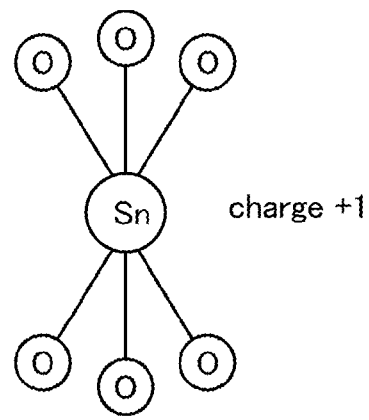
Figure 16B:
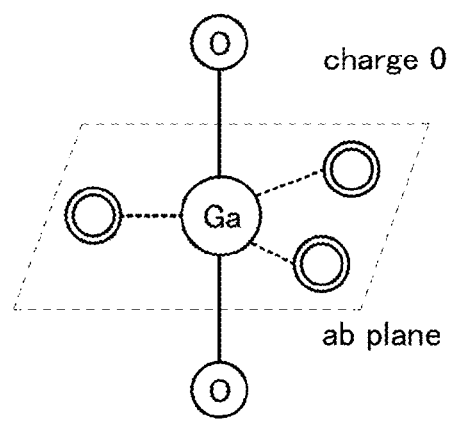

FIG. 16B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom.

All the three tricoordinate O atoms exist on the a-b plane. One tetracoordinate O atom exists in each of the upper half and the lower half in the structure B.

An In atom can also have the structure B because the In atom can have five ligands. The electric charge of the small group illustrated in the structure B is 0.

Figure 16E:
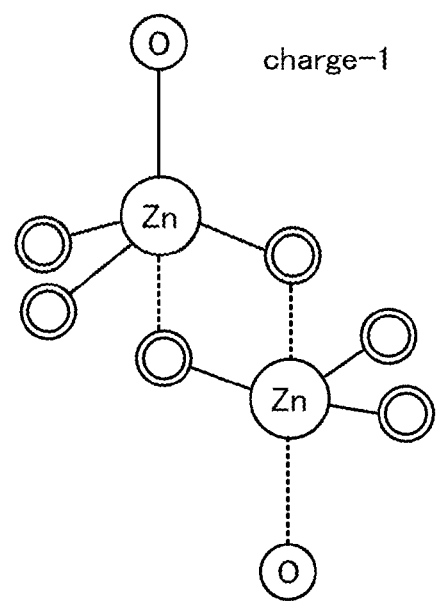
Figure 16C:
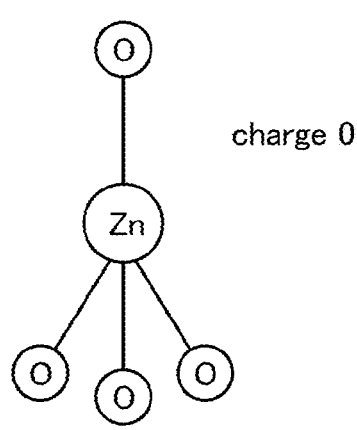

FIG. 16C illustrates a structure C including one tetracoordinate Zn atom and four tetracoordinate O atoms proximate to the Zn atom.

In the structure C, one tetracoordinate O atom exists in the upper half and three tetracoordinate O atoms exist in the lower half The electric charge of the small group in the structure C is 0.

FIG. 16D illustrates a structure D including one hexacoordinate Sn atom and six tetracoordinate O atoms proximate to the Sn atom.

In the structure D, three tetracoordinate O atoms exist in each of the upper half and the lower half.

The electric charge of the small group illustrated in the structure D is +1.

FIG. 16E illustrates a structure E including two Zn atoms.

In the structure E, one tetracoordinate O atom exists in each of the upper half and the lower half. The electric charge of the small group illustrated in the structure E is −1.

In this embodiment, a group of a plurality of small groups is referred to as a medium group, and a group of a plurality of medium groups is referred to as a large group (also referred to as a unit cell).

A rule of bonding the small groups to each other is described below.

The three O atoms in the upper half with respect to the hexacoordinate In atom in FIG. 16A has three proximate In atoms in the downward direction, and the three O atoms in the lower half has three proximate In atoms in the upward direction.

The one O atom in the upper half with respect to the pentacoordinate Ga atom in FIG. 16B has one proximate Ga atom in the downward direction, and the one O atom in the lower half has one proximate Ga atom in the upward direction.

The one O atom in the upper half with respect to the one tetracoordinate Zn atom in FIG. 16C has one proximate Zn atom in the downward direction, and the three O atoms in the lower half has three proximate Zn atoms in the upward direction.

In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms.

Since the coordination number of the tetracoordinate O atom is 4, the sum of the number of metal atoms proximate to and below the O atom and the number of metal atoms proximate to and above the O atom is 4.

Accordingly, when the sum of the number of tetracoordinate O atoms above a metal atom and the number of tetracoordinate O atoms below another metal atom is 4, the two kinds of small groups including the metal atoms can be bonded to each other.

The reason therefore is described below. For example, in the case where the hexacoordinate metal (In or Sn) atom is bonded through three tetracoordinate O atoms in the lower half, it is bonded to the pentacoordinate metal (Ga or In) atom in the lower half or the tetracoordinate metal (Zn) atom in the upper half.

A metal atom whose coordination number is 4, 5, or 6 is bonded to another metal atom through a tetracoordinate O atom in the c-axis direction.

In addition, a medium group can also be formed in a different manner by combining a plurality of small groups so that the total electric charge of the layered structure is 0.

Figure 17A:
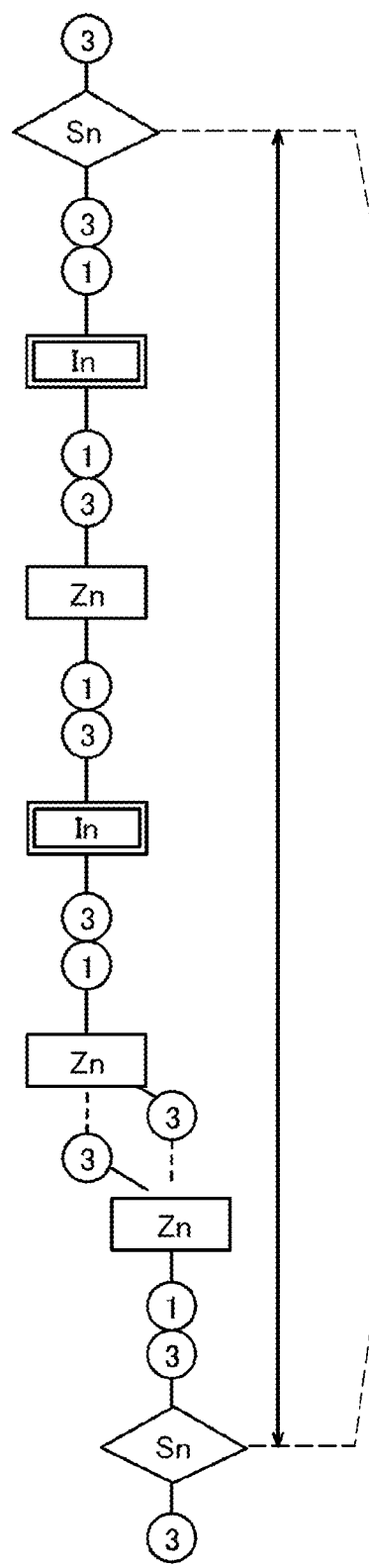
FIGS. 17A to 17C illustrate examples of an oxide semiconductor.

FIG. 17A illustrates a model of a medium group A included in a layered structure of an In—Sn—Zn—O-based material.

Figure 17B:
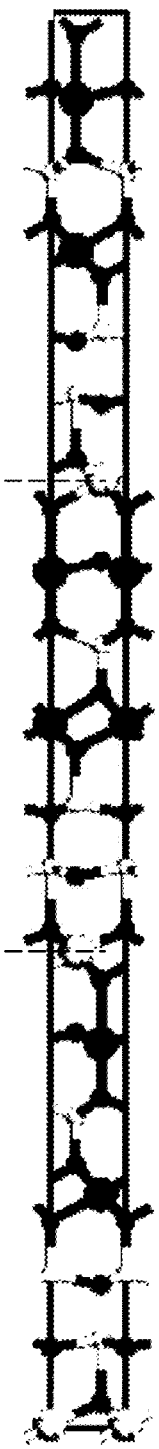

FIG. 17B illustrates a large group B including three medium groups.

Figure 17C:
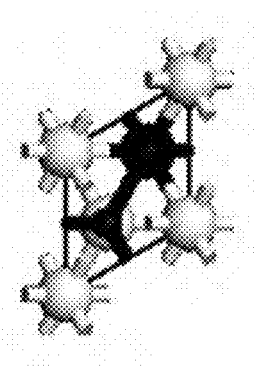

FIG. 17C illustrates an atomic arrangement where the layered structure shown in FIG. 17B is observed from the c-axis direction.

In the medium group A, a tricoordinate O atom is omitted for simplicity, and a tetracoordinate O atom is illustrated by a circle; the number in the circle shows the number of tetracoordinate O atoms.

For example, three tetracoordinate O atoms existing in each of the upper half and the lower half with respect to a Sn atom are denoted by circled 3.

Similarly, in the medium group A, one tetracoordinate O atom existing in each of the upper half and the lower half with respect to an In atom is denoted by circled 1.

In addition, n the medium group A, a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half are illustrated.

In the medium group A in FIG. 17 included in the layered structure of the In—Sn—Zn—O-based material, in the order starting from the top, a Sn atom proximate to three tetracoordinate O atoms in each of the upper half and the lower half is bonded to an In atom proximate to one tetracoordinate O atom in each of the upper half and the lower half.

The In atom is bonded to a Zn atom proximate to three tetracoordinate O atoms in the upper half.

The Zn atom is bonded to an In atom proximate to three tetracoordinate O atoms in each of the upper half and the lower half through one tetracoordinate O atom in the lower half with respect to the Zn atom.

The In atom is bonded to a small group that includes two Zn atoms and is proximate to one tetracoordinate O atom in the upper half.

The small group is bonded to a Sn atom proximate to three tetracoordinate O atoms in each of the upper half and the lower half through one tetracoordinate O atom in the lower half with respect to the small group.

A plurality of such medium groups is bonded to form a large group.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1.

Therefore, electric charge of −1, by which the electric charge of +1 is canceled, is needed to form a layered structure including a Sn atom.

As a structure having electric charge of −1, the small group including two Zn atoms as illustrated in the structure E can be given.

For example, with one small group including two Zn atoms, electric charge of one small group including a Sn atom can be cancelled, so that the total electric charge of the layered structure can result in 0.

Specifically, by repeating the large group illustrated in FIG. 17B, an In—Sn—Zn—O-based crystal ($In_2SnZn_3O_8$) can be formed.

The layered structure of the In—Sn—Zn—O-based crystal can be expressed by a composition formula, $In_2SnZn_2O_7(ZnO)_m$ (m is 0 or a natural number).

The In—Sn—Zn—O-based crystal is preferable because the crystallinity of the In—Sn—Zn—O-based crystal can be improved by increasing the number of m, which is preferable.

The above-described rule is also applied to the following oxides.

Figures 18A, 18B, 18C:
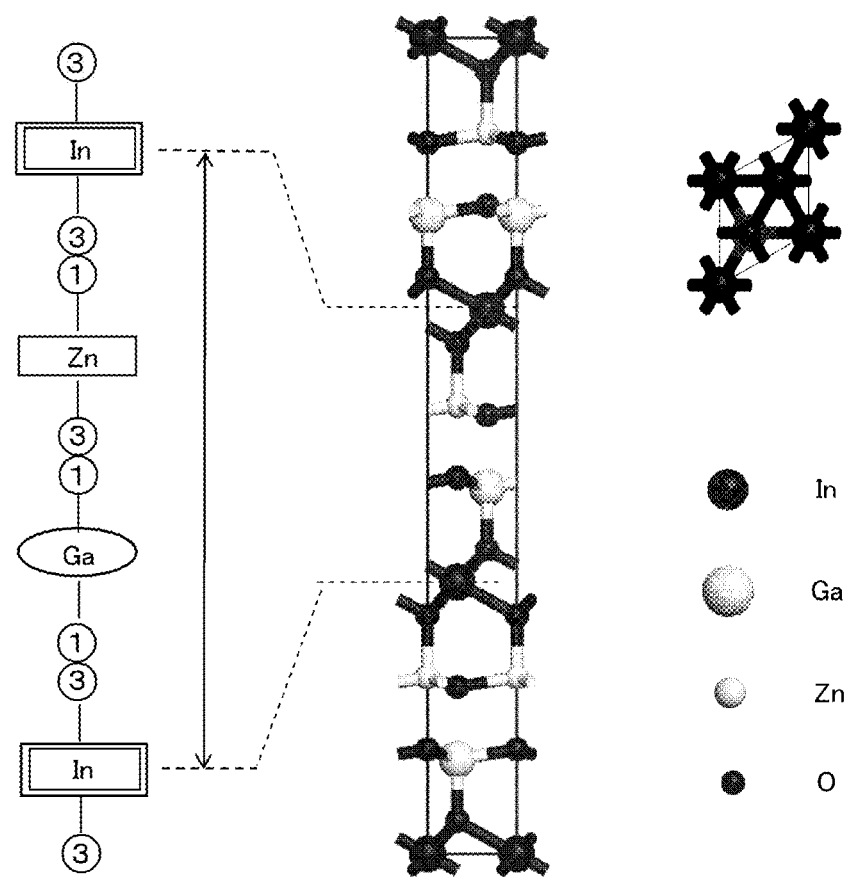
FIGS. 18A to 18C illustrate examples of an oxide semiconductor.

For example, FIG. 18A illustrates a model of a medium group included in a layered structure of an In—Ga—Zn—O-based material.

In the medium group L included in the layered structure of the In—Ga—Zn—O-based material in FIG. 18A, in the order starting from the top, an In atom proximate to three tetracoordinate O atoms in each of the upper half and the lower half is bonded to a Zn atom proximate to one tetracoordinate O atom in the upper half.

The Zn atom is bonded to a Ga atom proximate to one tetracoordinate O atom in each of the upper half and the lower half through three tetracoordinate O atoms in the lower half with respect to the Zn atom The Ga atom is bonded to an In atom proximate to three tetracoordinate O atoms in each of the upper half and the lower half through one tetracoordinate O atom in the lower half with respect to the Ga atom.

A plurality of such medium groups are bonded to form a large group.

FIG. 18B illustrates a large group M including three medium groups.

FIG. 18C illustrates an atomic arrangement where the layered structure shown in FIG. 18B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of the In atom, the Zn atom, and the Ga atom is 0.

As a result, the total electric charge of a medium group having a combination of these small groups always results in 0.

In order to form the layered structure of the In—Ga—Zn—O-based material, a large group can be formed using not only the medium group L but also a medium group in which the arrangement of the In atom, the Ga atom, and the Zn atom is different from that of the medium group L.

This embodiment can be implemented in appropriate combination with any structure described in the other embodiments.

Embodiment 7

The actually measured field-effect mobility of an insulated gate transistor is lower than its inherent mobility because of a variety of reasons, which occurs not only in the case of using an oxide semiconductor.

One of causes for reduction in the mobility is a defect inside a semiconductor or a defect at an interface between the semiconductor and an insulating film. With a Levinson model, the field-effect mobility on the assumption that no defect exists inside the semiconductor can be calculated theoretically.

Assuming a potential barrier (such as a grain boundary) exists in a semiconductor, the measured field-effect mobility of the semiconductor, denoted by μ can be expressed by Formula I where the inherent mobility of the semiconductor is $\mu_0$.

$$\mu = \mu_0 \exp\left(-\frac{E}{kT}\right) \quad \text{[Formula 1]}$$

In the formula, E denotes the height of the potential barrier, k denotes the Boltzmann constant, and T denotes the absolute temperature.

Further, on the assumption that the potential barrier is attributed to a defect, the height of the potential barrier can be expressed by Formula 2 according to the Levinson model.

$$E = \frac{e^2 N^2}{8\varepsilon n} = \frac{e^3 N^2 t}{8\varepsilon C_{ox} V_g} \quad \text{[Formula 2]}$$

In the formula, e denotes the elementary charge, N denotes the average defect density per unit area in a channel, ε denotes the permittivity of the semiconductor, n denotes the number of carriers per unit area in the channel, $C_{ox}$ denotes the capacitance per unit area, $V_g$ denotes the gate voltage, and t denotes the thickness of the channel.

In the case where the thickness of the semiconductor layer is less than or equal to 30 nm, the thickness of the channel can be regarded as being the same as the thickness of the semiconductor layer.

The drain current $I_d$ in a linear region of the semiconductor layer can be expressed by Formula 3.

$$I_d = \frac{W \mu V_g V_d C_{ox}}{L} \exp\left(-\frac{E}{kT}\right) \quad \text{[Formula 3]}$$

In the formula, L denotes the channel length and W denotes the channel width, and L and W are each 10 μM in this example.

In addition, $V_d$ denotes the drain voltage.

Both sides of the above formula are divided by $V_g$ and then logarithms of both the sides are taken, resulting in Formula 4.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT\varepsilon C_{ox} V_g} \quad \text{[Formula 4]}$$

In Formula 4, a logarithm of $V_g$ is expressed in the right side.

From the formula, it is found that the average defect density N can be obtained from the slope of a line taken with $\ln(I_d/V_g)$ as the ordinate and $1/V_g$ as the abscissa.

That is, the average defect density can be evaluated from the $I_d$–$V_g$ characteristics of the transistor.

The average defect density N of an oxide semiconductor in which the ratio of indium (In), tin (Sn), and zinc (Zn) is 1:1:1 is about $1 \times 10^{12}/\text{cm}^2$.

On the basis of the average defect density obtained in this manner, or the like, $\mu_0$ results in 120 cm²/Vs from the formulae.

The measured mobility of an In—Sn—Zn oxide including a defect is about 35 cm²/Vs.

However, assuming that no defect exists inside an oxide semiconductor and at the interface between the oxide semiconductor and an insulating layer, the mobility $\mu_0$ of the oxide semiconductor is estimated to be 120 cm²/Vs.

However, even when no defect exists inside the semiconductor, scattering at an interface between a channel and a gate insulating layer affects the transport property of the transistor. In other words, the mobility $\mu_1$ at a position that is a distance x away from the interface between the channel and the gate insulating layer is expressed by Formula 5.

$$\frac{1}{\mu_1} = \frac{1}{\mu_0} + \frac{D}{B} \exp\left(-\frac{x}{G}\right) \quad \text{[Formula 5]}$$

In the formula, D denotes the electric field in the gate direction, and B and G are constants. The values of B and G can be obtained from actual measurement results; according to the above measurement results, B is $4.75 \times 10^7$ cm/s and G is 10 nm (the depth to which the influence of interface scattering reaches).

As D increases (i.e., as the gate voltage increases), the second term of Formula 5 is increased and accordingly the mobility $\mu_1$ is decreased.

Figure 19:
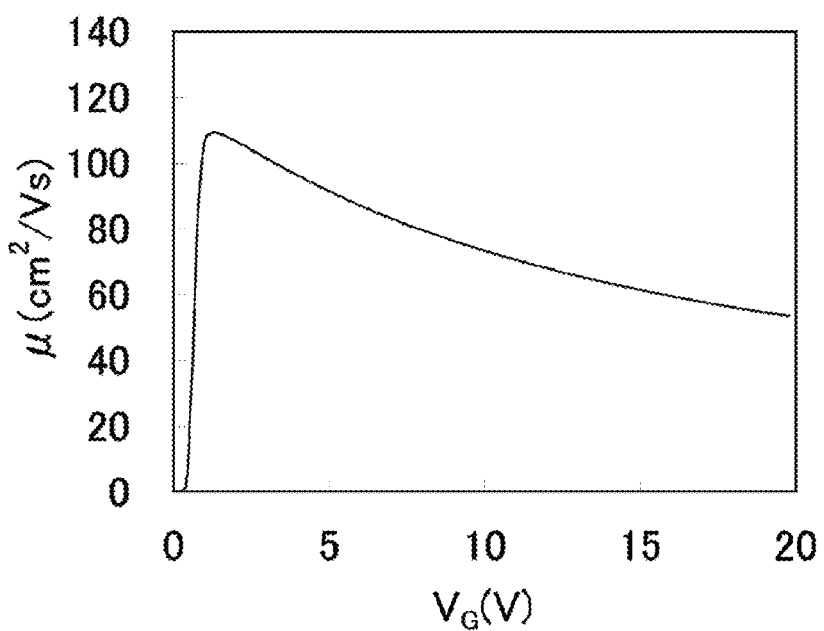
FIG. 19 illustrates a relation between the gate voltage and the field-effect mobility.

Calculation results E of the mobility $\mu_2$ of a transistor whose channel is formed in an ideal oxide semiconductor without a defect inside the semiconductor are shown in FIG. 19.

For the calculation, device simulation software, Sentaurus Device manufactured by Synopsys, Inc. was used In addition, for the calculation, the bandgap, the electron affinity, the relative permittivity, and the thickness of the oxide semiconductor were set to 2.8 eV, 4.7 eV, 15, and 15 nm, respectively Those values were obtained according to measurement of a thin film of an oxide semiconductor that was formed by a sputtering method.

Further, the work functions of a gate, a source, and a drain of the transistor were set to 5.5 eV, 4.6 eV, and 4.6 eV, respectively.

The thickness of a gate insulating layer of the transistor was set to 100 nm, and the relative permittivity thereof was set to 4.1. The channel length and the channel width were each 10 µm, and the drain voltage $V_d$ was set to 0.1 V.

As shown in the calculation results E, the mobility has a peak of more than 100 cm²/Vs at a gate voltage that is a little over 1 V, and decreases as the gate voltage becomes further higher because the influence of interface scattering is increased.

In order to reduce interface scattering, it is desirable that a top surface of the semiconductor layer be flat at the atomic level (atomic layer flatness).

Characteristics of a minute transistor which was manufactured using an oxide semiconductor having such a mobility were calculated.

The transistor used for calculation includes a channel formation region provided between a pair of n-type semiconductor regions in the oxide semiconductor layer.

For the calculation, the resistivity of the pair of n-type semiconductor regions was set to $2 \times 10^{-3}$ Ωcm.

In addition, the channel length was set to 33 µm and the channel width was set to 40 µm for the calculation.

Further, a sidewall is provided on the side wall of the gate electrode.

The calculation was performed under the condition that part of the semiconductor region which overlaps with the sidewall is an offset region.

For the calculation, device simulation software, Sentaurus Device manufactured by Synopsys, Inc. was used.

Figure 20A:
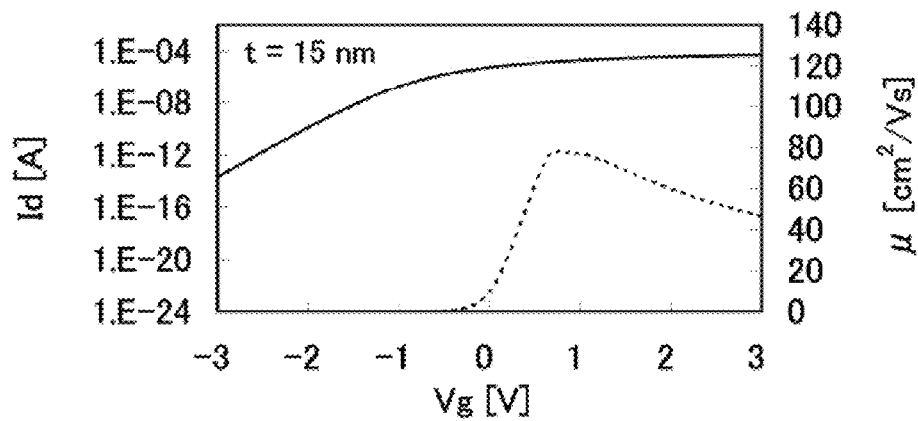
FIGS. 20A to 20C each show a relation between the gate voltage and the drain current.
Figure 20B:
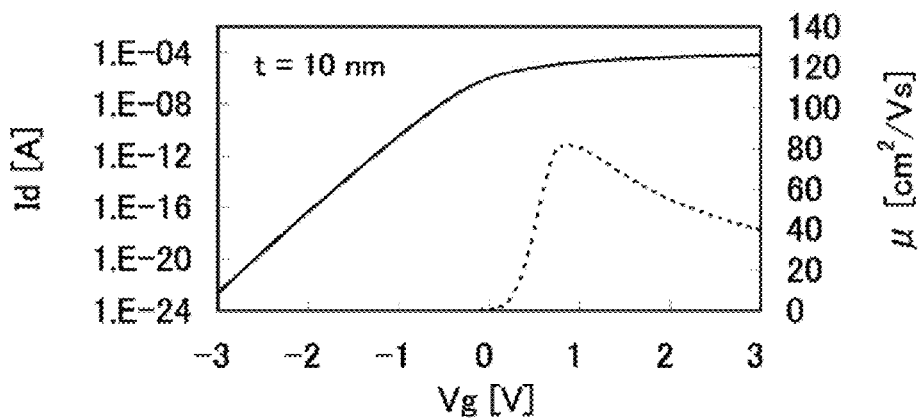
Figure 20C:
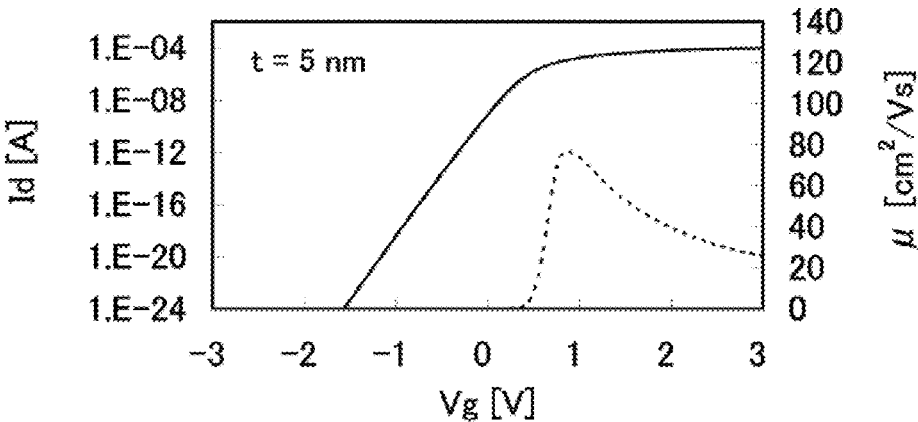

FIGS. 20A to 20C show the gate voltage ($V_g$: a potential difference between the gate and the source) dependence of the drain current ($I_d$, indicated by a solid line) and the mobility (µ, indicted by a dotted line) of the transistor.

The drain current $I_d$ was calculated where the drain voltage (a potential difference between the drain and the source) was +1 V and the mobility µ was calculated where the drain voltage was +0.1 V.

FIG. 20A shows the calculation result where the thickness of the gate insulating film was 15 nm.

FIG. 20B shows the calculation result where the thickness of the gate insulating film was 10 mm.

Figure 21A:
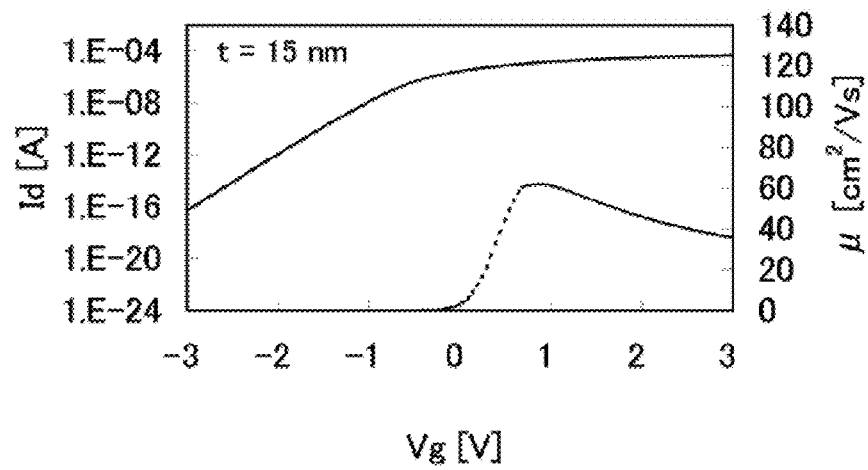
FIGS. 21A to 21C each show a relation between the gate voltage and the drain current.
Figure 21B:
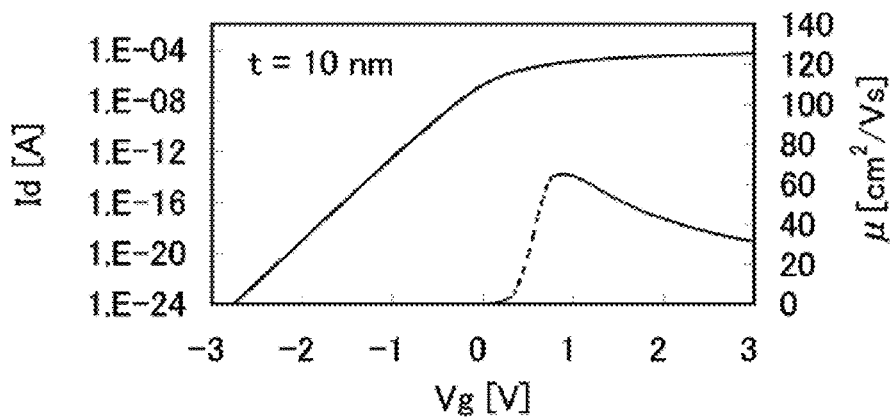
Figure 21C:
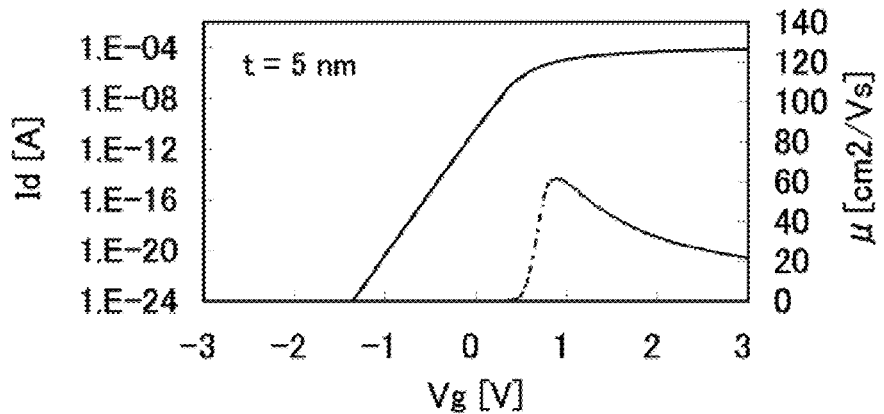

FIG. 21C shows the calculation result where the thickness of the gate insulating film was 5 nm.

As the gate insulating layer gets thinner, the drain current $I_d$ (off-state current) particularly in an off state is significantly decreased.

In contrast, there is no remarkable change in the peak value of the mobility p and the drain current $I_d$ (on-state current) in an on state.

FIGS. 21A to 21C show the gate voltage $V_g$ dependence of the drain current $I_d$ (indicated by a solid line) and the mobility µ (indicated by a dotted line) of the transistor where the offset length (sidewall length) $L_{off}$ was 5 nm.

The drain current $I_d$ was calculated where the drain voltage was +1 V and the mobility µ was calculated where the drain voltage was +0.1 V.

FIG. 21A shows the calculation result where the thickness of the gate insulating film was 15 nm.

FIG. 21B shows the calculation result where the thickness of the gate insulating film was 10 nm.

FIG. 21A shows the calculation result where the thickness of the gate insulating film was 5 nm.

Figure 22A:
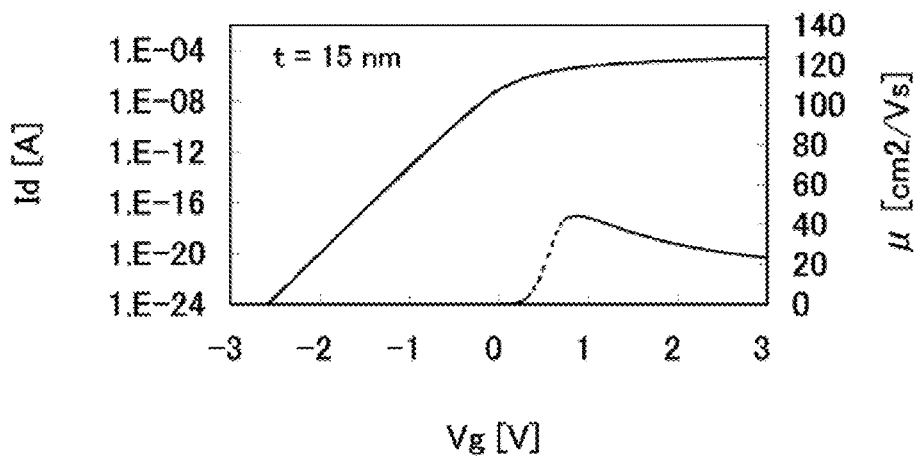
FIGS. 22A to 22C each show a relation between the gate voltage and the drain current.
Figure 22B:
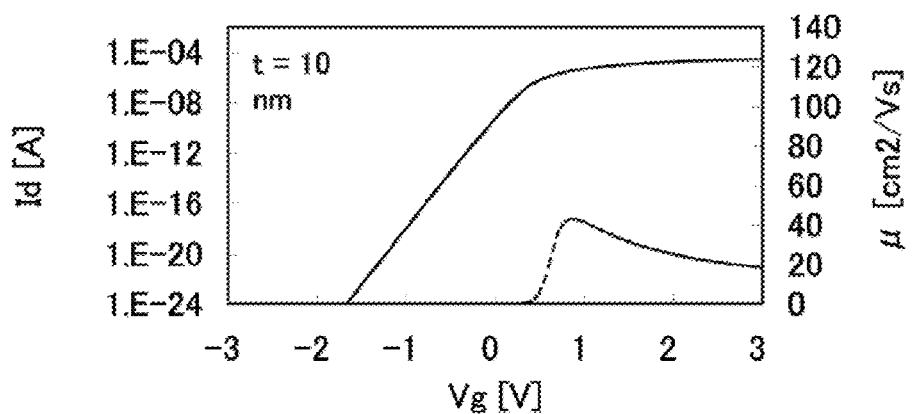
Figure 22C:
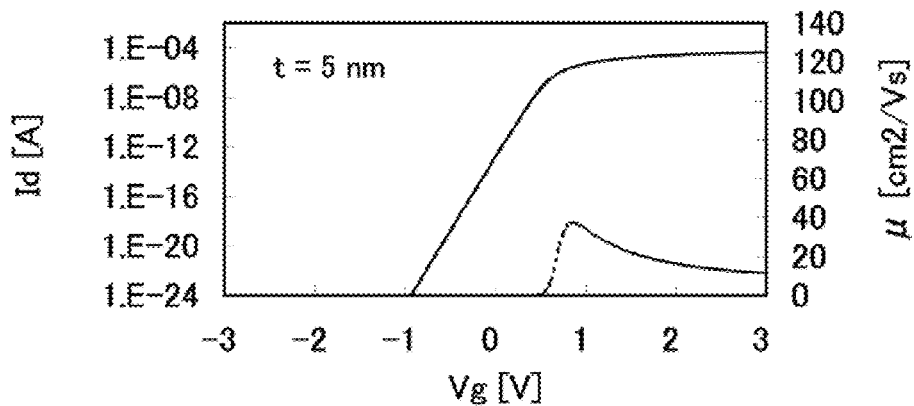

FIGS. 22A to 22C show the gate voltage $V_g$ dependence of the drain current $I_d$ (indicated by a solid line) and the mobility µ (indicated by a dotted line) of the transistor where the offset length (sidewall length) $L_{off}$ was 15 nm.

The drain current $I_d$ was calculated where the drain voltage was +1 V and the mobility p was calculated where the drain voltage was +0.1 V.

FIG. 22A shows the calculation result where the thickness of the gate insulating film was 15 nm.

FIG. 22B shows the calculation result where the thickness of the gate insulating film was 10 nm.

FIG. 22C shows the calculation result where the thickness of the gate insulating film was 5 nm.

In any of the structures, as the gate insulating layer gets thinner, the off-state current is significantly decreased, whereas no remarkable change occurs in the peak value of the mobility µ and the on-state current.

The peak of the mobility µ is about 80 cm²/Vs in FIGS. 20A to 20C, about 60 cm²/Vs in FIGS. 21A to 21C, and about 40 cm²/Vs in FIGS. 22A to 22C; thus, the peak of the mobility µ decreases as the offset length $L_{off}$ is increased.

The same applies to the off-state current.

The on-state current also decreases as the offset length $L_{off}$ is increased; however, the decrease in the on-state current is much more gradual than the decrease in the off-state current.

Further, any of the graphs shows that the drain current exceeds 10 µA, which is needed for a memory element or the like, at a gate voltage of around 1 V.

This embodiment can be implemented in appropriate combination with any structure described in the other embodiments.

Embodiment 8

A transistor including an oxide semiconductor (ITZO) containing In, Sn, and Zn can have favorable characteristics by deposition of the oxide semiconductor while heating a substrate or by heat treatment after deposition of an oxide semiconductor film.

Each of In, Sn, and Zn is preferably contained in a composition ratio at greater than or equal to 5 atomic %.

By heating the substrate after the deposition of the oxide semiconductor film containing In, Sn, and Zn, the field-effect mobility of the transistor can be improved.

The threshold voltage of an n-channel transistor can also be shifted in the positive direction.

The positive shift of the threshold voltage of the n-channel transistor makes the absolute value of a voltage used for keeping the n-channel transistor off to decrease, so that power consumption can be reduced.

Further, the n-channel transistor can become a normally-off transistor by a positive shift of the threshold voltage of the n-channel transistor such that the threshold voltage is 0V or more.

Characteristics of transistors using ITZO are described below.

(Common Conditions of Samples A to C)

An oxide semiconductor layer was formed over a substrate to have a thickness of 15 nm under the following conditions: a target having a composition ratio of In:Sn:Zn=1:1:1 is used; the gas flow rate is Ar/$O_2$=6/9 sccm; the deposition pressure is 0.4 Pa; and the deposition power is 100 W.

Next, the oxide semiconductor layer was etched in an island shape.

Then, a tungsten layer was deposited over the oxide semiconductor layer to have a thickness of 50 nm, and was etched, so that a source electrode and a drain electrode were formed.

Next, a silicon oxynitride film (SiON) was formed to have a thickness of 100 nm, using silane gas (SiH$_4$) and dinitrogen monoxide (N$_2$O) by a plasma-enhanced CVD method, to form a gate insulating film.

Next, a gate electrode was formed in the following manner a tantalum nitride layer was formed to have a thickness of 15 nm; a tungsten layer was formed to have a thickness of 135 nm; and the layers were etched.

Further, a silicon oxynitride (SiON) film with a thickness of 300 nm and a polyimide film with a thickness of 1.5 μm were formed by a plasma-enhanced CVD method to form an interlayer insulating film.

Next, a pad for measurement was formed in the following manner: a contact hole was formed in the interlayer insulating film; a first titanium film was formed to have a thickness of 50 nm; an aluminium film was formed to have a thickness of 100 nm; a second titanium film was formed to have a thickness of 50 nm; and the films were etched.

In this manner, a semiconductor device having a transistor was formed.
(Sample A)

In Sample A, heating was not performed to the substrate during the deposition of the oxide semiconductor layer.

Further in Sample A, heat treatment was not performed after the deposition of the oxide semiconductor layer before the etching of the oxide semiconductor layer.
(Sample B)

In Sample B, the oxide semiconductor layer was deposited with the substrate heated at 200° C.

Further in Sample B, heat treatment was not performed after the deposition of the oxide semiconductor layer before the etching of the oxide semiconductor layer.

The substrate was heated while the oxide semiconductor layer was deposited in order to remove hydrogen serving as a donor in the oxide semiconductor layer.
(Sample C)

In Sample C, the oxide semiconductor layer was deposited with the substrate heated at 200° C.

Further in Sample C, heat treatment in a nitrogen atmosphere was performed at 650° C. for one hour and then heat treatment in an oxygen atmosphere was performed at 650° C. for one hour after the oxide semiconductor layer was deposited before the oxide semiconductor layer was etched.

The heat treatment in a nitrogen atmosphere at 650° C. for one hour was performed in order to remove hydrogen serving as a donor in the oxide semiconductor layer.

Oxygen is also removed by the heat treatment used for removing hydrogen that serves as a donor in the oxide semiconductor layer, causing oxygen deficiency which serves as a carrier in the oxide semiconductor layer.

Hence, an effect of reducing oxygen deficiencies was tried to be obtained by performing the heat treatment in an oxygen atmosphere at 650° C. for one hour was performed to reduce the oxygen deficiency.
(Characteristics of Transistors of Sample A to Sample C)

Figure 23A:
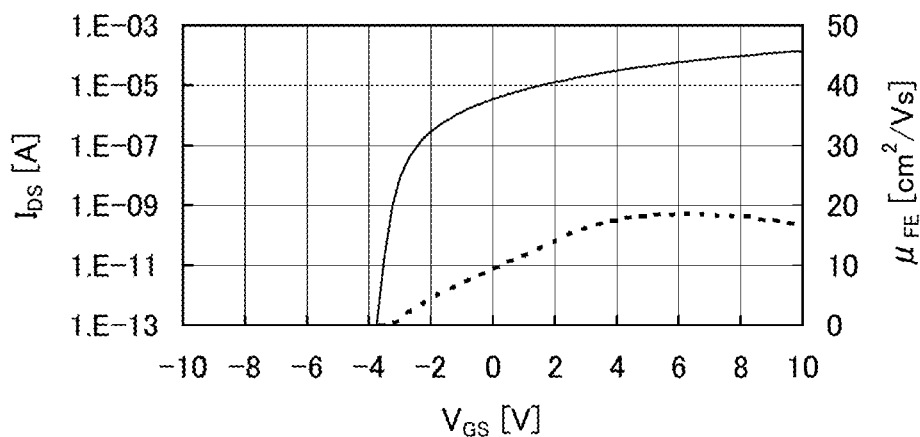
FIGS. 23A to 23C each show characteristics of a transistor.

FIG. 23A shows initial characteristics of a transistor of Sample A.

Figure 23B:
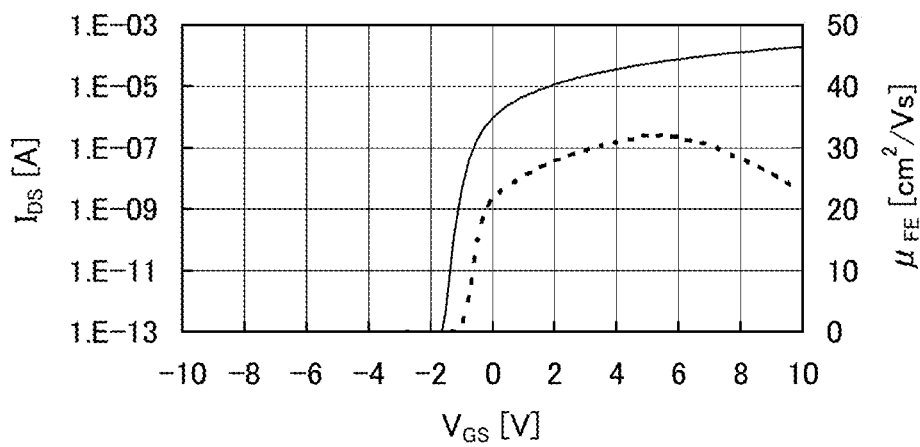

FIG. 23B shows initial characteristics of a transistor of Sample B.

Figure 23C:
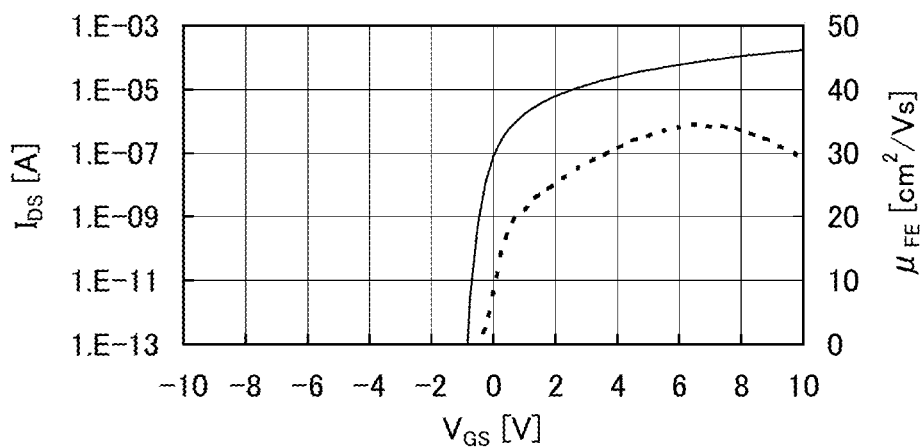

FIG. 23C shows initial characteristics of a transistor of Sample C.

The field-effect mobility of the transistor of Sample A was 18.8 cm$^2$/Vsec.

The field-effect mobility of the transistor of Sample B was 32.2 cm$^2$/Vsec.

The field-effect mobility of the transistor of Sample C was 34.5 cm$^2$/Vsec.

According to observation of cross sections of oxide semiconductor layers which were formed by deposition methods similar to respective those of Samples A to C, with a transmission electron microscope (TEM), crystallinity was observed in samples formed by the deposition methods similar to respective those of Sample B and Sample C, substrates of which were heated during deposition.

Further, surprisingly, the samples, the substrates of which were heated during deposition, had a non-crystalline portion and a crystalline portion having a c-axis crystalline orientation.

In a conventional polycrystal, the crystalline orientation in the crystalline portion is not aligned. Therefore, it can be said that the sample, the substrate of which was heated during deposition, may have a novel structure.

Comparison of FIGS. 23A to 23C brings understanding that heat treatment performed to the substrate during or after deposition can remove an hydrogen element serving as a donor, thereby shifting the threshold voltage of the n-channel transistor in the positive direction.

That is, the threshold voltage of Sample B with heating of the substrate during deposition is shifted in the positive direction as compared to the threshold voltage of Sample A without heating of the substrate during deposition.

In addition, it is found from comparison of Sample B and Sample C both with heating of the substrate during deposition that the threshold voltage of Sample C with the heat treatment after deposition is shifted in the positive direction as compared to the threshold voltage of Sample B without the heat treatment after deposition.

As the temperature of heat treatment is higher, a light element such as hydrogen is removed more easily; therefore, as the temperature of heat treatment is higher, hydrogen is easily removed more easily.

Accordingly, it can be considered that the threshold voltage can be more shifted in the positive direction by further increasing the temperature of the heat treatment during or after deposition.
(Results of the Gate BT Stress Test of Sample B and Sample C)

A gate BT stress test was performed on Sample B (without heat treatment after deposition) and Sample C (with heat treatment after deposition).

First, $V_{gs}$-$I_{ds}$ characteristics of each transistor were measured at a substrate temperature of 25° C. and $V_{ds}$ of 10 V whereby the characteristics of the transistor before heating and application of a high positive voltage were measured.

Next, the substrate temperature was set to 150° C. and $V_{ds}$ was set to 0.1 V.

After that, 20 V was applied as $V_{gs}$ to the gate insulating film, and was kept for 1 hour.

Then, $V_{gs}$ was set to 0 V.

Next, $V_{gs}$-$I_{ds}$ characteristics of the transistor were measured at a substrate temperature of 25° C. and $V_{ds}$ of 10 V, whereby the characteristics of the transistor after heating and application of a high positive voltage were measured.

Comparison of the characteristics of a transistor before and after heating and application of a high positive voltage as described above is referred to as a positive BT test.

On the other hand, first, $V_{gs}$-$I_{ds}$ characteristics of each transistor were measured at a substrate temperature of 25° C. and $V_{ds}$ of 10 V, whereby the characteristics of the transistor before heating and application of a high negative voltage were measured.

Then, the substrate temperature was set to 150° C. and $V_{ds}$ was set to 0.1 V.

Next, −20 V was applied as $V_{gs}$ to the gate insulating film, and was kept for 1 hour.

Next, $V_{gs}$ was set to 0 V.

Then, $V_{gs}$-$I_{ds}$ characteristics of the transistor were measured at a substrate temperature of 25° C. and $V_{ds}$ of 10 V, whereby the characteristics of the transistor after heating and application of a high negative voltage were measured.

Comparison of the characteristics of the transistor before and after heating and application of a high negative voltage as described above is referred to as a negative BT test.

Figure 24A:
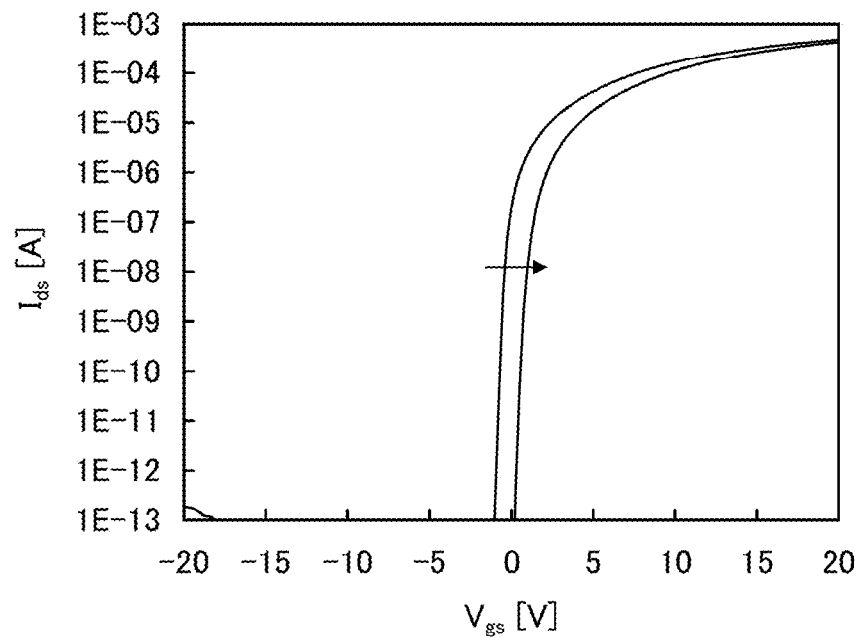
FIGS. 24A and 24B each show characteristics of a transistor.
Figure 24B:
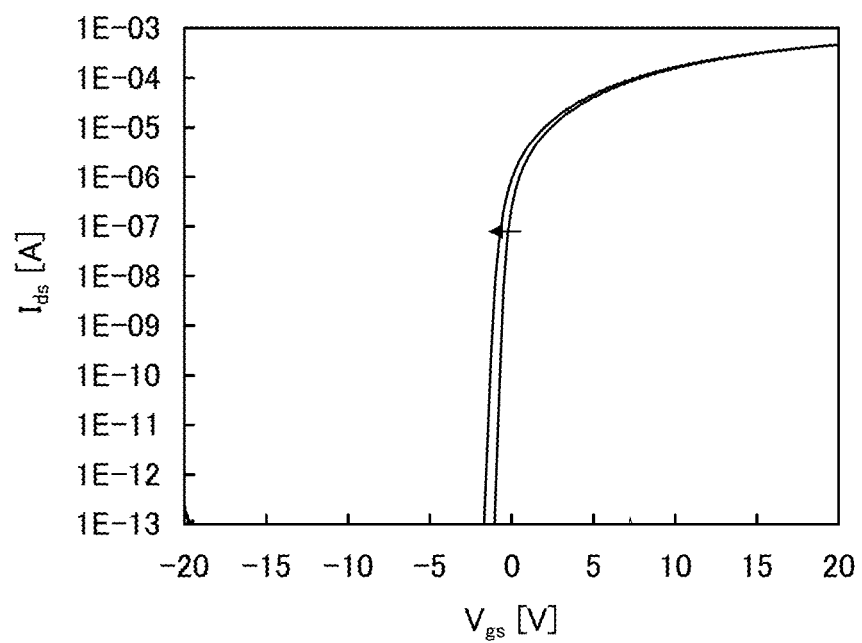

FIG. 24A shows results of the positive BT test of Sample B, and FIG. 24B shows results of the negative BT test of Sample B.

Figure 25A:
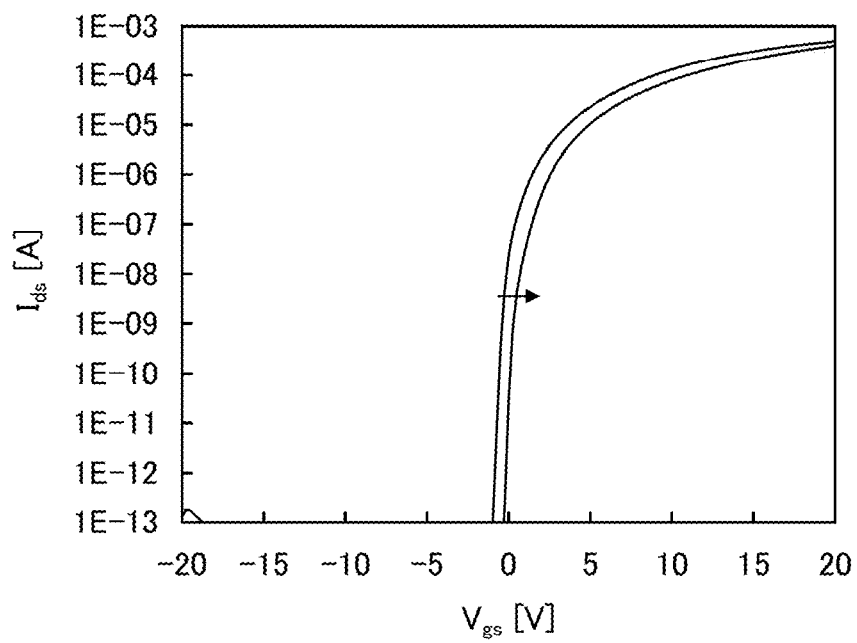
FIGS. 25A and 25B each show characteristics of a transistor.
Figure 25B:
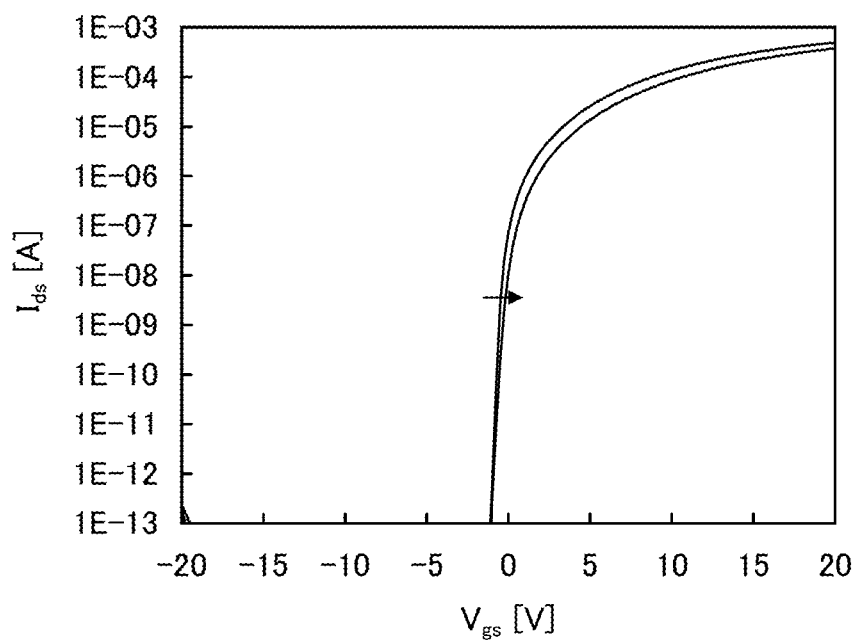

FIG. 25A shows results of the positive BT test of Sample C, and FIG. 25B shows results of the negative BT test of Sample C.

Although the positive BT test and the negative BT test are tests for determining the deterioration level of a transistor, it is found from FIGS. 24A and 25A that the threshold voltage can be shifted in the positive direction by performing at least the positive BT test.

In particular, it is found that the positive BT test made the transistor a normally-off transistor in FIG. 24A.

Accordingly, it is found that, with the positive BT test as well as the heat treatment in manufacturing the transistors, a shift of the threshold voltage in the positive direction can be promoted and the transistor can be made to a normally-off transistor.

Figure 26:
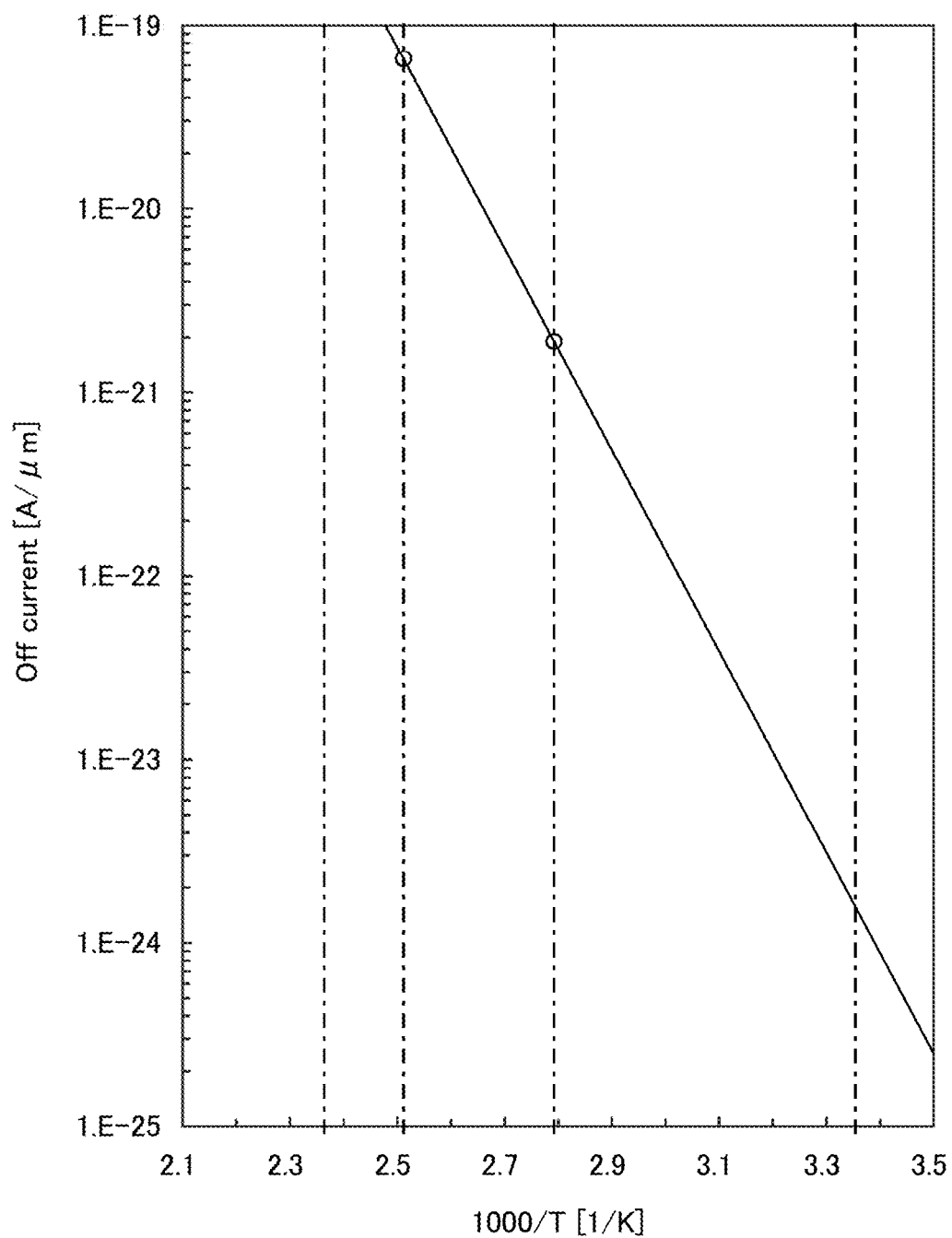
FIG. 26 shows temperature dependence of off-state current of a transistor.

FIG. 26 shows a relation between the off-state current of the transistor of Sample A and the inverse of the substrate temperature (absolute temperature) at measurement.

In FIG. 26, the horizontal axis represents a value (1000/T) obtained by multiplying the inverse of the substrate temperature at measurement by 1000.

The amount of current in FIG. 26 is the amount of current per micrometer in the channel width.

The off-state current was less than or equal to $1 \times 10^{-19}$ A at a substrate temperature of 125° C. (1000/T is about 2.51).

The off-state current was less than or equal to $1 \times 10^{-20}$ A at a substrate temperature of 85° C. (1000/T is about 3.66).

In other words, it was found that the off-state current is extremely low as compared to a transistor including a silicon semiconductor.

The off-state current is decreased as the temperature decreases; therefore, it is clear that the off-state current is lower at room temperature.

This embodiment can be implemented in appropriate combination with any structure described in the other embodiments.

Embodiment 9

An example of a specific structure of a driver circuit in a memory device according to one embodiment of the present invention is described.

Figure 9:
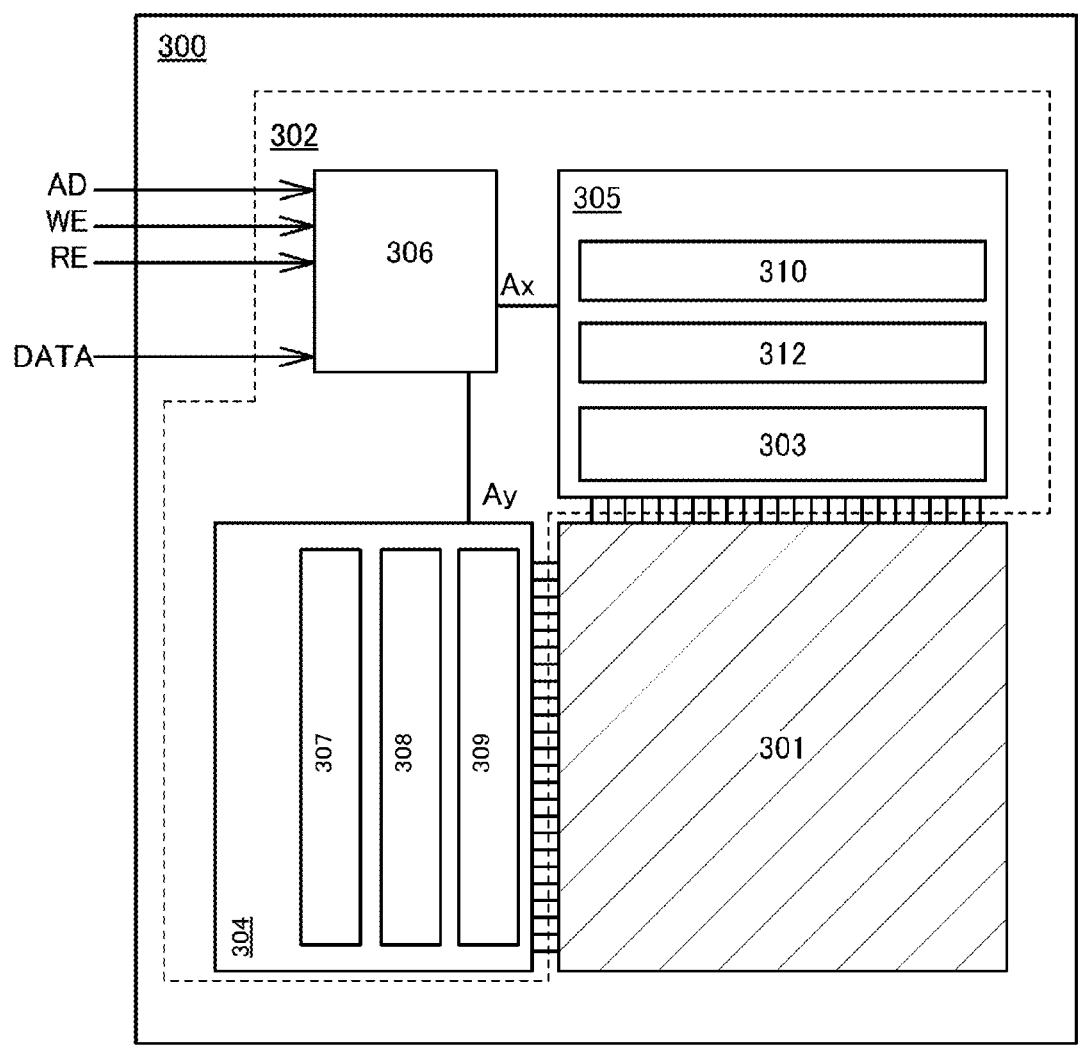
FIG. 9 illustrates Embodiment 5.

FIG. 9 illustrates a specific structure of a memory device according to one embodiment of the present invention, in a block diagram. In the block diagram in FIG. 9, circuits in the memory device are classified in accordance with their functions and illustrated as separate blocks; however, it is difficult to classify actual circuits according to their functions completely and one circuit may have a plurality of functions.

A memory device 300 illustrated in FIG. 9 includes a cell array 301 and a driver 302. The driver 302 includes a word line driver 304 for controlling the potential of a word line, and a data line driver 305 for controlling data writing and data reading in a memory cell in the cell array 301. Further, the driver 302 includes a controller 306 for controlling operations of the word line driver 304 and the data line driver 305. Further, the data line driver 305 in the driver 302 includes a refresh circuit (not shown) for refreshing written data.

Further, in the memory device 300 illustrated in FIG. 9, the word line driver 304 includes a decoder 307, a level shifter 308, and a buffer 309. The data line driver 305 includes a decoder 310, a selector 312, and a reading circuit 303 for generating a signal containing data read from the cell array 301.

According to one embodiment of the present invention, the memory device 300 includes at least the cell array 301. Further, according to one embodiment of the present invention, the memory device 300 includes in its category a memory module in which at least part of the driver 302 is connected to the cell array 301. The memory module may be provided with a connection terminal which can be mounted on a printed wiring board or the like and may be protected with resin or the like, i.e., may be packaged.

The cell array 301, the word line driver 304, the data line driver 305, and the controller 306 may be formed using one substrate. Alternatively, any one of them may be formed using a substrate different from a substrate for the others, or they may be formed using different substrates individually.

In the case of using different substrates, electrical connection can be provided with the use of an FPC (flexible printed circuit) or the like. In that case, part of the driver 302 may be connected to an FPC by a COF (chip on film) method. Electrical connection can also be provided by a COG (chip on glass) method.

A signal AD containing an address (Ax, Ay) of the cell allay 301 as data is input to the memory device 300, and the controller 306 transmits the address Ax in a column direction and the address Ay in a row direction to the data line driver 305 and the word line driver 304, respectively. In addition, the controller 306 transmits a signal DATA containing data input to the memory device 300 to the data line driver 305.

Operation of writing data and operation of reading data in the cell array 301 are selected in accordance with a signal RE (read enable), a signal WE (write enable), or the like supplied to the controller 306.

When the writing operation is selected in accordance with the signal WE, a signal for selecting memory cells in the address Ay is generated in the decoder 307 in the word line driver 304 in response to an instruction from the controller 306. The amplitude of the signal is adjusted by the level shifter 308, and then the waveform thereof is processed in the buffer 309 and the signal is input to the cell array 301. In the data line driver 305, a signal for selecting memory cells in the address Ax among the memory cells selected in the decoder 310 is generated in response to an instruction from the controller 306. The signal is input to a selector 312. In the selector 312, the signal DATA is sampled in accordance with the input signal, and the sampled signal is input to a memory cell in the address (Ax, Ay).

When the reading operation is selected in accordance with the signal RE, a signal for selecting memory cells in the address Ay is generated in the decoder 307 in the word line driver 304 in response to an instruction from the controller 306. The amplitude of the signal is adjusted by the level shifter 308, and then the waveform thereof is processed in the buffer 309 and the processed signal is input to the cell array 301. In the reading circuit 303, a memory cell in the address Ax is selected among the memory cells selected by the decoder 307 in response to an instruction from the controller 306. Then, data stored in the memory cell in the address (Ax, Ay) is read, and a signal containing the data is generated.

Each memory cell described in this embodiment is the memory device of the above-described embodiment, i.e., a memory device whose power consumption can be reduced by reducing the frequency of refresh operations without increasing the voltage and a memory device whose data can be read out without destroying written data.

This embodiment can be implemented in appropriate combination with any structure described in the other embodiments.

Embodiment 10

In this embodiment, an example of a specific structure of the reading circuit described in the above-described embodiment is described.

The level of the potential read from the cell array is determined in accordance with data written to the memory cell. Accordingly, in an ideal view, the potentials read from the plurality of memory cells are the same level when data with the same digital value is stored in each of the plurality of memory cells. However, practically, there is a case where the characteristics of transistors functioning as memory elements or transistors functioning as switching elements are varied among the memory cells. In that case, the potentials which are actually read are varied even if all of data to be read has the same digital value, bringing a range of distribution of the potentials. Therefore, it is preferable to provide, for the driver, a reading circuit in which a signal containing correct data with an amplitude and an waveform processed in accordance with specifications can be generated even in the case where a little variation occurs in the potentials read from the cell allay.

Figure 10:
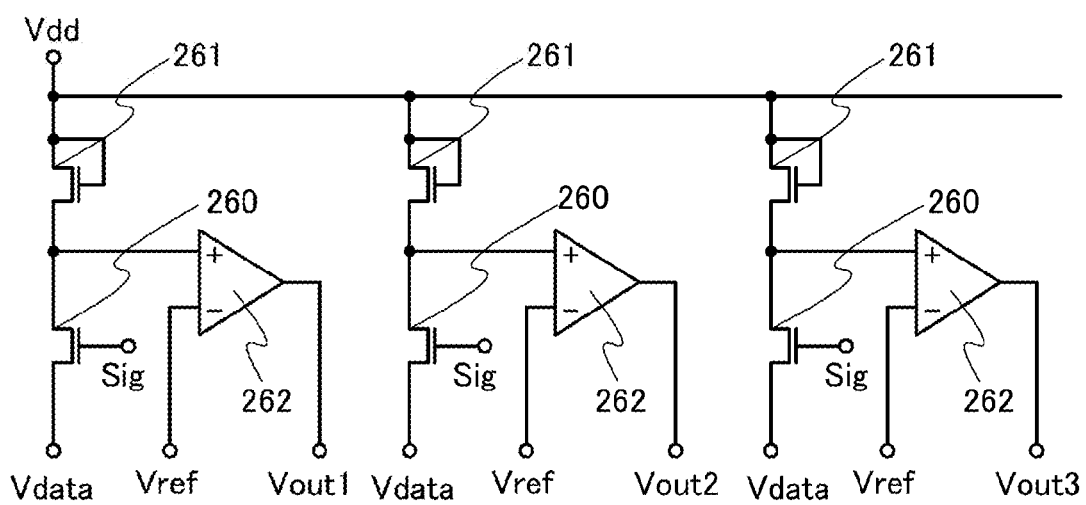
FIG. 10 illustrates Embodiment 6.

FIG. 10 illustrates an example of a circuit diagram of a reading circuit. The reading circuit illustrated in FIG. 10 includes a transistor 260 which functions as a switching element for controlling an input of a potential $V_{data}$ read from the cell array to the reading circuit, and a transistor 261 which function as a resistor. The reading circuit illustrated in FIG. 10 also includes an operational amplifier 262.

Specifically, a gate electrode of the transistor 261 is connected to a drain terminal of the transistor 261, and a high-level power supply potential $V_{dd}$ is supplied to the gate electrode and the drain terminal. Further, a source terminal of the transistor 261 is connected to a non-inversion input terminal (+) of the operational amplifier 262. Accordingly, the transistor 261 functions as a resistor connected between a node to which the power supply potential $V_{dd}$ is supplied and the non-inversion input terminal (+) of the operational amplifier 262. Although a transistor whose gate electrode is connected to the drain terminal is used as a resistor in FIG. 10, one embodiment of the present invention is not limited thereto: any element functioning as a resistor can be used instead.

Further, a gate electrode of the transistor 260 functioning as a switching element is connected to a data line. Then, the supply of the potential $V_{data}$ to a source electrode of the transistor 260 is controlled in accordance with the potential of the data line.

The transistor 260 connected to the data line is turned on, so that a potential obtained by dividing the potential $V_{data}$ and the power supply potential $V_{dd}$ with the use of resistors, i.e., the transistor 260 and the transistor 261, is supplied to the non-inversion input terminal (+) of the operational amplifier 262. The level of the power supply potential $V_{dd}$ is fixed; thus, the level of the potential obtained by the resistive division reflects the level of the potential $V_{data}$, i.e., a digital value of read data.

On the other hand, a reference potential $V_{ref}$ is supplied to an inversion input terminal (−) of the operational amplifier 262. The level of a potential $V_{out}$ of an output terminal can be changed depending on the level of the potential applied to the non-inversion input terminal (+) with respect to the reference potential $V_{ref}$. Thus, a signal which indirectly contains data can be obtained.

Even if data with the same value is stored in the memory cells, the level of the read potential $V_{data}$ may vary due to variation in characteristics of the memory cells, bringing a range of distribution of the level of potential. The level of the reference potential $V_{ref}$ is determined in consideration of variation in the potential $V_{data}$ of the node in order to read the value of data accurately.

Since FIG. 10 illustrates an example of a reading circuit in the case of handling a binary digital value, one operational amplifier used for reading data is used for each node to which the potential $V_{data}$ is supplied. However, the number of operational amplifiers in one embodiment of the present invention is not limited thereto. When n-valued data (n is a natural number of 2 or more) is used, the number of operational amplifiers used for each node to which the potential $V_{data}$ is supplied is (n−1).

This embodiment can be implemented in appropriate combination with any structure described in the other embodiments.

Embodiment 11

In this embodiment, application of the memory device described in the above-described embodiment to an electronic device is described with reference to FIGS. 11A to 11F. In this embodiment, application of the above-described memory device to electronic devices such as a computer, a cellular phone (also referred to as a mobile phone or a mobile phone set), a portable information terminal (including a portable game machine, an audio reproducing device, and the like), a camera such as a digital camera or a digital video camera, electronic paper, and a television set (also referred to as a television or a television receiver) is described.

Figure 11A:
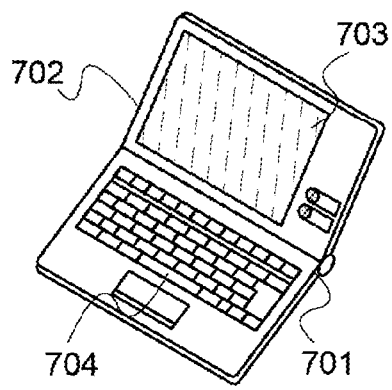
FIGS. 11A to 11F illustrate Embodiment 7.

FIG. 11A illustrates a laptop personal computer, which includes a housing 701, a housing 702, a display portion 703, a keyboard 704, and the like. The memory device described in the above-described embodiment is provided inside at least one of the housings 701 and 702. Accordingly, a laptop personal computer in which data writing and data reading are performed at high speed, data can be retained for a long time, and power consumption is sufficiently low can be provided.

Figure 11B:
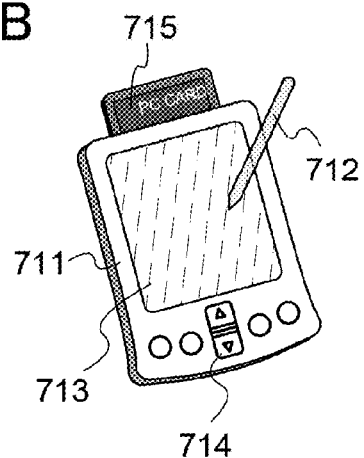

FIG. 11B illustrates a portable information terminal (PDA) including a main body 711 provided with a display portion 713, an external interface 715, an operation button 714, and the like. Further, a stylus 712 for operation of the portable information terminal and the like are provided. In the main body 711, the memory device described in the above-described embodiment is provided. Accordingly, a portable information terminal in which data writing and data reading are performed at high speed, data can be retained for a long time, and power consumption is sufficiently low can be provided.

Figure 11C:
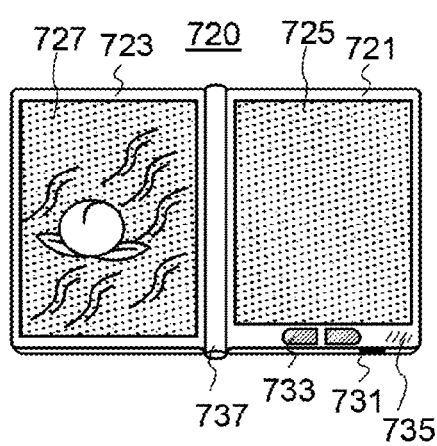

FIG. 11C illustrates an electronic book reader 720 equipped with electronic paper, which includes two housings, a housing 721 and a housing 723. The housing 721 and the housing 723 are provided with a display portion 725 and a display portion 727, respectively. The housings 721 and 723 are connected by a hinge 737 and can be opened or closed with the hinge 737 as an axis. The housing 721 is provided with a power supply 731, an operation key 733, a speaker 735, and the like. At least one of the housings 721 and 723 is provided with the memory device described in the above-described embodiment. Accordingly, an e-book reader in which data writing and data reading are performed at high speed, data can be retained for a long time, and power consumption is sufficiently low can be provided.

Figure 11D:
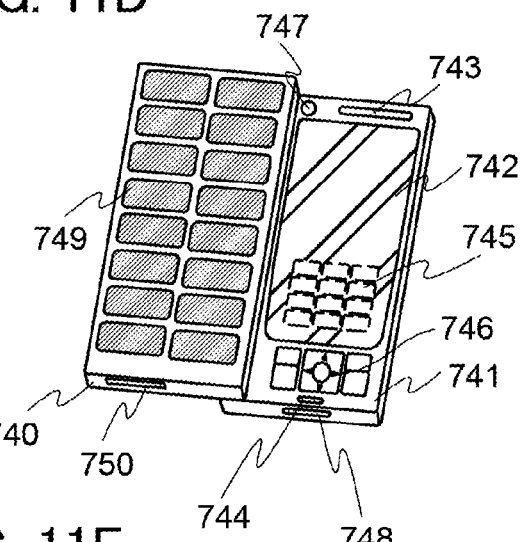

FIG. 11D illustrates a mobile phone, which includes two housings, a housing 740 and a housing 741. Moreover, the housings 740 and 741 in a state where they are developed as illustrated in FIG. 11D can be slid so that one overlaps with the other, which makes the mobile phone suitable for being carried around. The housing 741 includes a display panel 742, a speaker 743, a microphone 744, an operation key 745, a pointing device 746, a camera lens 747, an external connection terminal 748, and the like. The housing 740 includes a solar cell 749 for charging the mobile phone, an external memory slot 750, and the like. In addition, an antenna is incorporated in the housing 741. At least one of the housings 740 and 741 is provided with the memory device described in the above-described embodiment. Accordingly; a mobile phone in which data writing and data reading are performed at high speed, data can be retained for a long time, and power consumption is sufficiently low can be provided.

Figure 11E:
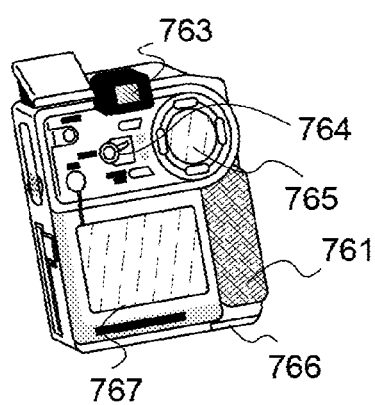

FIG. 11E illustrates a digital camera, which includes a main body 761, a display portion 767, an eyepiece 763, an operation switch 764, a display portion 765, a battery 766, and the like. In the main body 761, the memory device described in the above-described embodiment is provided. Accordingly, a digital camera in which data writing and data reading are performed at high speed, data can be retained for a long time, and power consumption is sufficiently low can be provided.

Figure 11F:
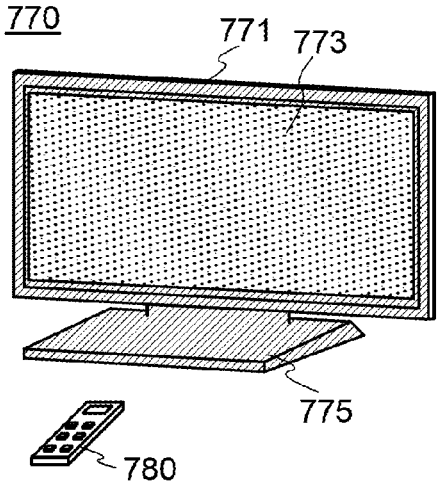

FIG. 11F illustrates a television set 770, which includes a housing 771, a display portion 773, a stand 775, and the like. The television set 770 can be operated with a switch provided for the housing 771 or with a remote controller 780. The memory device described in the above-described embodiment is provided for the housing 771 and the remote controller 780. Accordingly, a television set in which data writing and data reading are performed at high speed, data can be stored for a long time, and power consumption is sufficiently low can be provided.

As described above, the memory device described in the above embodiment is provided for each of the electronic devices described in this embodiment. Accordingly, an electronic device whose power consumption can be reduced by reducing the frequency of refresh operations without increasing the voltage and an electronic device whose data can be read out without destroying written data can be provided.

Example 1

In this example, examples in the case where the memory device described in the above embodiment is applied to a mobile electronic device (a mobile device) such as a mobile phone, a mobile phone called a smart phone with enhanced data processing function, and an e-book reader is described. In such a mobile device, an SRAM or a DRAM is used to store image data temporarily at present because a flash memory which is slow in response is not suitable for image processing.

Figure 12A:
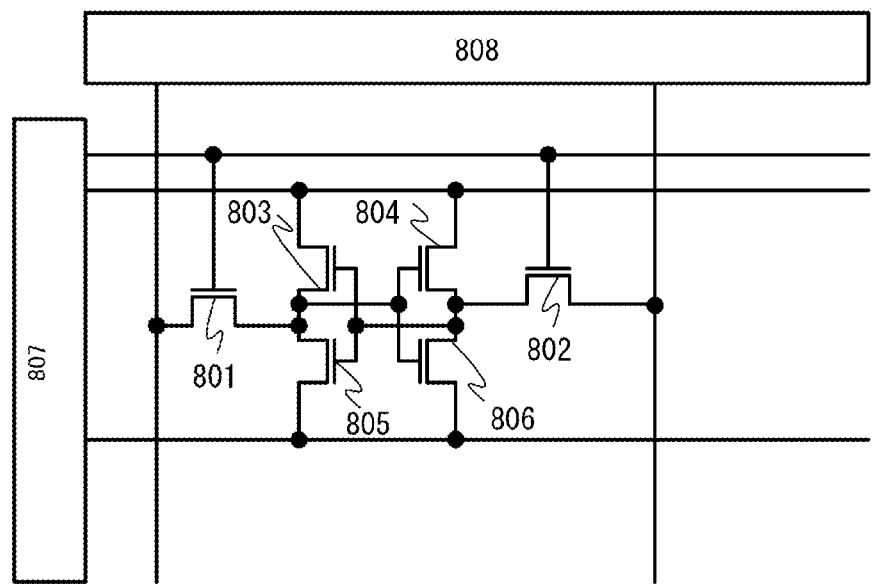
FIGS. 12A and 12B illustrate Example 1.

However, the case where the SRAM or the DRAM is used to store image data temporarily has the following drawback. The SRAM has an advantage of rapid response. In the general SRAM, one memory cell consists of six transistors 801 to 806 as shown in FIG. 12A, which is driven by a word line driver 807 and a data line driver 808. The transistor 803 and the transistor 805 form an inverter and the transistor 804 and the transistor 806 form an inverter in the SRAM circuit shown in FIG. 12A, which enables high-speed operation. However, since one memory cell consists of six transistors, there is a drawback of large cell area. Provided that the minimum feature size of a design rule is F, the area of a memory cell in an SRAM is generally $100 F^2$ to $150 F^2$. Therefore, a price per bit of an SRAM is the most expensive among a variety of memory devices.

Figure 12B:
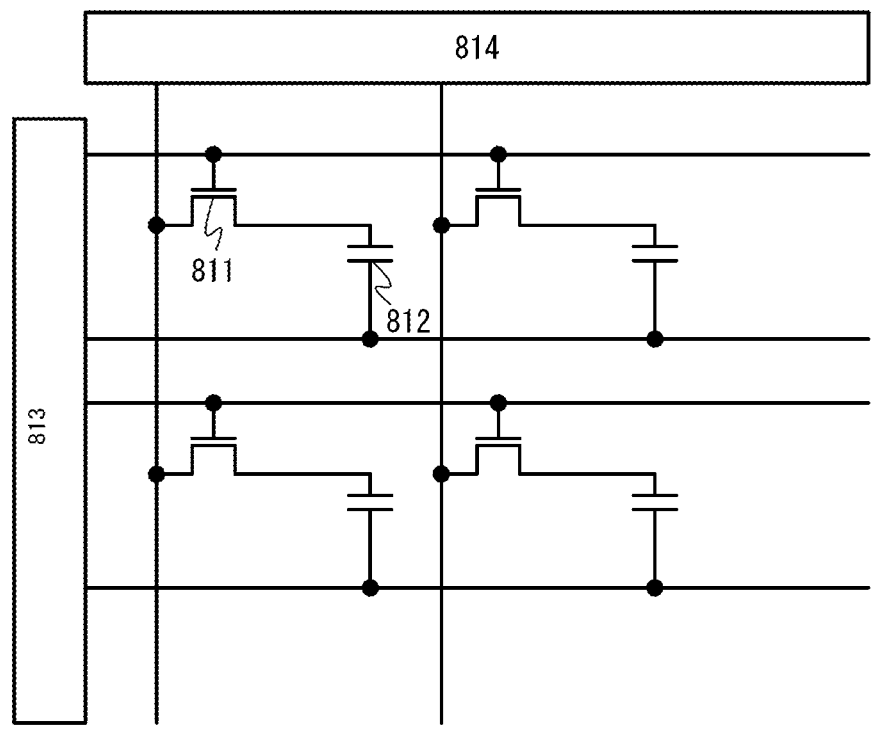

In the DRAM, one memory cell consists of a transistor 811 and a capacitor 812 as shown in FIG. 12B, which is driven by a word line driver 813 and a data line driver 814. The cell area of the DRAM in which one memory cell consists of one transistor and one capacitor is smaller than that of the SRAM, and is generally $10 F^2$ or less. However, the DRAM needs a refresh operation, whereby power is consumed even when data rewriting is not performed.

In the memory device described in the above-described embodiment, the area of the memory cell can be reduced to about $10 F^2$ and the frequency of refresh operations can be reduced. Accordingly, by employing the memory device described in the above-described embodiment, the cell area and power consumption can be reduced.

Figure 13:
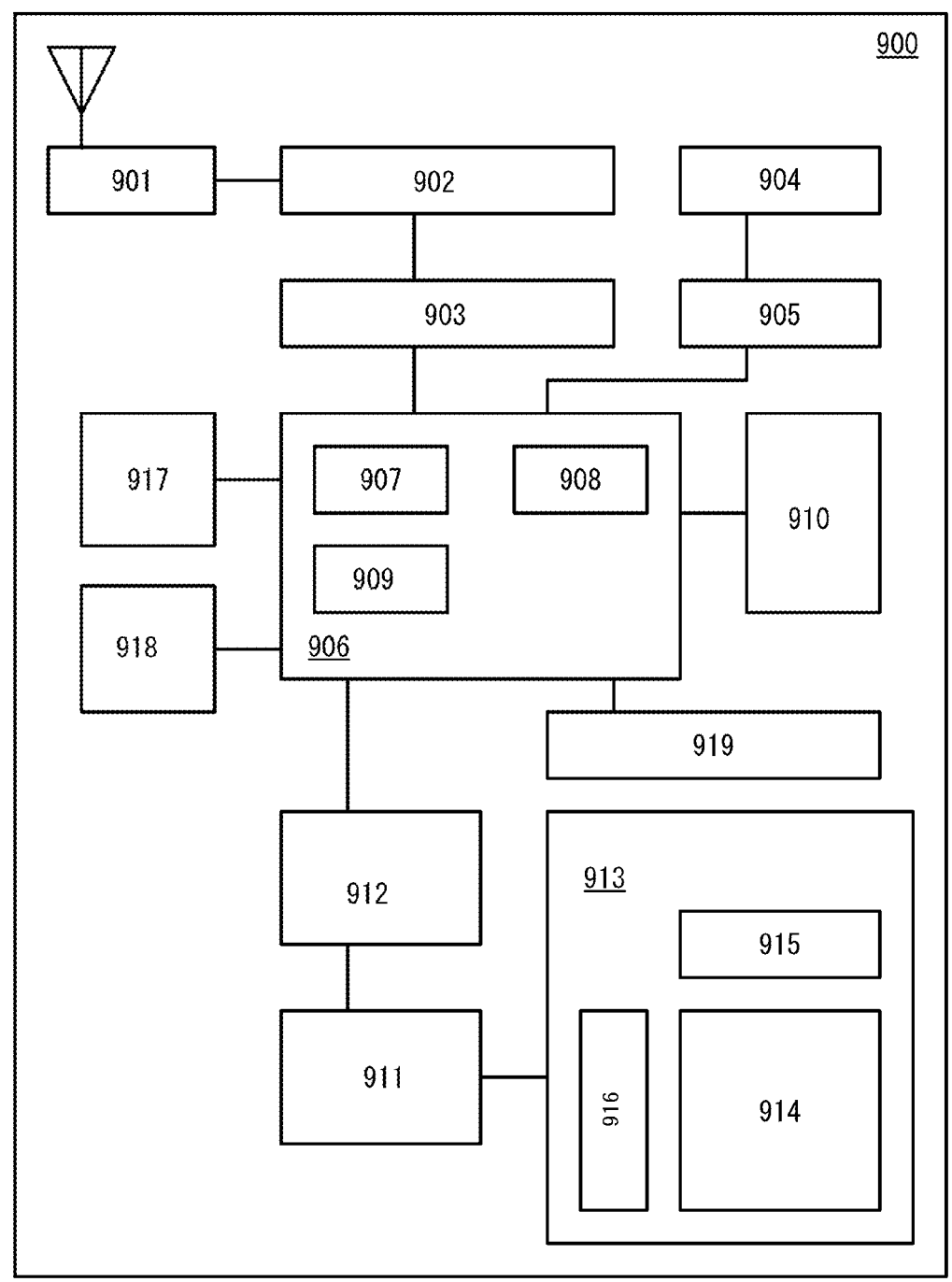
FIG. 13 illustrates Example 1.

FIG. 13 is an example of a block diagram of a mobile phone. A mobile phone 900 shown in FIG. 13 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, and a keyboard 918. The display 913 includes a display portion 914, a source driver 915, and a gate driver 916. The application processor 906 includes a CPU 907, a DSP 908, and an interface 909. By employing the memory device described in the above-described embodiment to the memory circuit 912, memory cost per bit and power consumption can be reduced.

Figure 14:
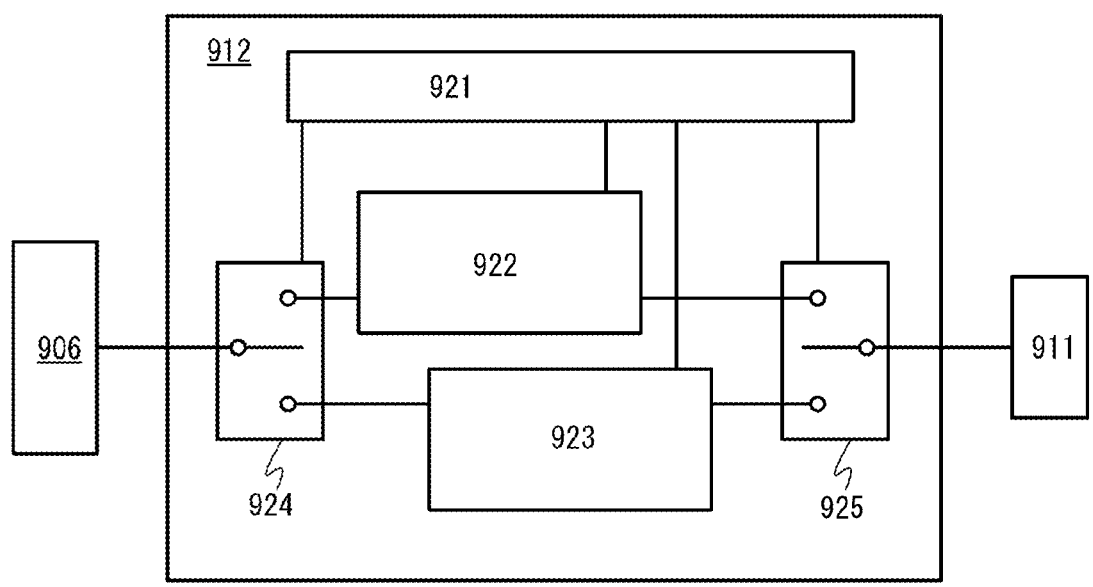
FIG. 14 illustrates Example 1.

FIG. 14 is an example of a block diagram of the memory circuit 912. The memory circuit 912 includes memories 922 and 923 using the memory device described in the above-described embodiment, switches 924 and 925, and a memory controller 921.

First, image data is formed by reception or the application processor 906. The formed image data is stored in the memory 922 through the switch 924. Then, the data is transmitted to the display 913 through the switch 924 and the display controller 911 to be displayed. As long as the image data is the same, the following operation is repeated: image data is read out at a frequency of about 30 to 60 Hz and is sent to the display controller 911 through the switch 925. Upon rewriting data on the screen, the application processor 906 generates new image data, and the image data is stored in the memory 923 through the switch 924. Also during that period, image data is read out periodically from the memory 922 through the switch 925. After the termination of storing new image data in the memory 923, reading of data stored in the memory 923 is started from the next frame of the display 913; image data is transmitted to the display 913 through the switch 925 and the display controller 911 to be displayed, which is repeated until the next image data is stored in the memory 922. In this manner, data writing and data reading are performed alternately in the memories 922 and 923, whereby display is performed on the display 913.

The memories 922 and 923 are not necessarily separate memory chips, and may be obtained by dividing one memory chip.

By employing the structure of the memory device described in the above-described embodiment to the memory 922, 923, the unit price and power consumption can be reduced.

Figure 15:
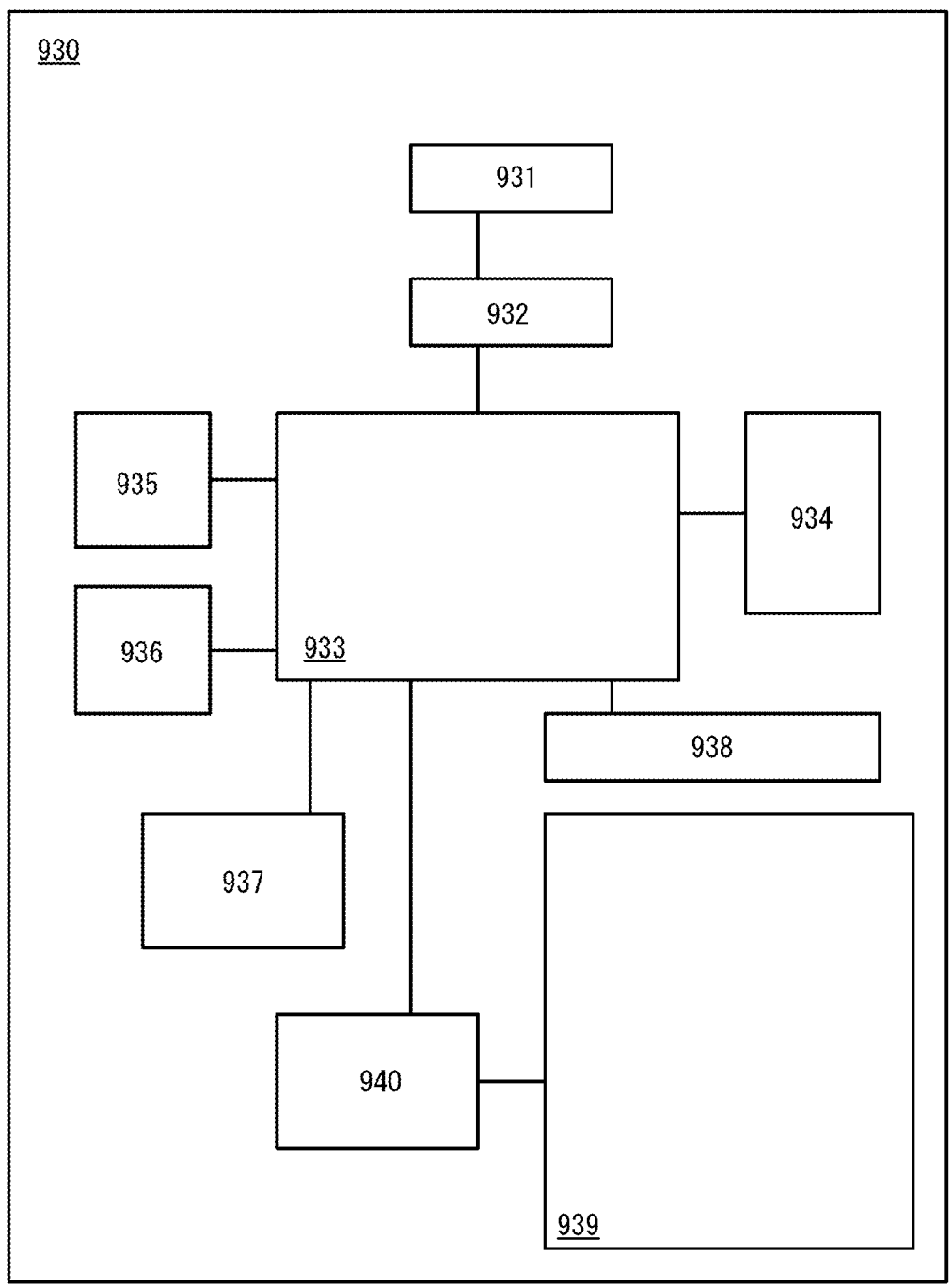
FIG. 15 illustrates Example 1.

FIG. 15 is a block diagram of an e-book reader. An e-book reader 930 shown in FIG. 15 includes a battery 931, a power supply circuit 932, a microprocessor 933, a flash memory 934, an audio circuit 935, a keyboard 936, a memory circuit 937, a touch panel 938, a display 939, and a display controller 940. The memory device described in the above-described embodiment can be employed to the memory circuit 937. The memory circuit 937 functions to temporarily retain the content of the book, including a user's highlight. In order to retain that content for a long period, that content may be copied to the flash memory 934.

By employing the memory device described in the above-described embodiment to the structure shown in FIG. 15, the unit price and power consumption can be reduced.

This application is based on Japanese Patent Application serial nos. 2010-291861 and 2011-108896 filed with Japan Patent Office on Dec. 28, 2010 and May 14, 2011, respectively, the entire contents of which are hereby incorporated by reference.

What is claimed is:

1. A memory device comprising:
a memory cell comprising a first transistor, a second transistor, and a first insulating film,
wherein the first transistor comprises:
a first oxide semiconductor layer including a first channel formation region;
a first electrode connected to the first oxide semiconductor layer;
a second electrode connected to the first oxide semiconductor layer;
a first gate electrode overlapping with the first channel formation region; and
a second insulating layer interposed between the first gate electrode and the first oxide semiconductor layer,
wherein the second transistor comprises:
a second gate electrode;
a third insulating film over the second gate electrode;
a second oxide semiconductor layer including a second channel formation region over the third insulating film;
a third electrode connected to the second oxide semiconductor layer;
a fourth electrode connected to the second oxide semiconductor layer;
a fourth insulating film over the second oxide semiconductor layer, the third electrode, and the fourth electrode; and
a third gate electrode over the fourth insulating film,
wherein the second gate electrode, the third gate electrode, and the second channel formation region are overlapped with each other,
wherein the first oxide semiconductor layer is located above the third gate electrode, and
wherein the first oxide semiconductor layer is located above the first insulating film, and the second oxide semiconductor layer is located below the first insulating film.

2. The memory device according to claim 1,
wherein the first oxide semiconductor layer includes a region including a dopant, and
wherein the first electrode and the second electrode are electrically connected to the first channel formation region through the region.

3. The memory device according to claim 2,
wherein the dopant is selected from the group consisting of nitrogen, phosphorus, argon, arsenic, xenon, helium, and hydrogen.

4. The memory device according to claim 1,
wherein an area where the second oxide semiconductor layer overlaps with the second gate electrode is larger than that where the second oxide semiconductor layer overlaps with the third gate electrode.

5. The memory device according to claim 1,
wherein the first electrode is electrically connected to the third electrode.

6. The memory device according to claim 1,
wherein the first oxide semiconductor layer and the second oxide semiconductor layer include an In—Ga—Zn—O-based oxide semiconductor.

7. The memory device according to claim 1,
wherein a height of a top surface of the first insulating film and that of a top surface of the third gate electrode are substantially the same.

8. A memory module comprising the memory device according to claim 1.

9. An electronic device comprising the memory device according to claim 1.

10. A memory device comprising:
a memory cell comprising a first transistor, a second transistor, and a first insulating film,
wherein the first transistor comprises:
a first oxide semiconductor layer including a first channel formation region;
a first electrode connected to the first oxide semiconductor layer;
a second electrode connected to the first oxide semiconductor layer;
a first gate electrode overlapping with the first channel formation region; and
a second insulating layer interposed between the first gate electrode and the first oxide semiconductor layer,
wherein the second transistor comprises:
a second gate electrode;
a third insulating film over the second gate electrode;
a second oxide semiconductor layer including a second channel formation region over the third insulating film;
a third electrode connected to the second oxide semiconductor layer;
a fourth electrode connected to the second oxide semiconductor layer;
a fourth insulating film over the second oxide semiconductor layer, the third electrode, and the fourth electrode; and
a third gate electrode over the fourth insulating film,
wherein the second gate electrode, the third gate electrode, and the second channel formation region are overlapped with each other,
wherein the first oxide semiconductor layer is located above the third gate electrode,
wherein the first oxide semiconductor layer is located above the first insulating film, and the second oxide semiconductor layer is located below the first insulating film, and
wherein an area where the first oxide semiconductor layer overlaps with the first gate electrode is smaller than that where the second oxide semiconductor layer overlaps with the second gate electrode or the third gate electrode.

11. The memory device according to claim 10,
wherein the first oxide semiconductor layer includes a region including a dopant, and
wherein the first electrode and the second electrode are electrically connected to the first channel formation region through the region.

12. The memory device according to claim 11,
wherein the dopant is selected from the group consisting of nitrogen, phosphorus, argon, arsenic, xenon, helium, and hydrogen.

13. The memory device according to claim 10,
wherein an area where the second oxide semiconductor layer overlaps with the second gate electrode is larger than that where the second oxide semiconductor layer overlaps with the third gate electrode.

14. The memory device according to claim 10,
wherein the first electrode is electrically connected to the third electrode.

15. The memory device according to claim 10,
wherein the first oxide semiconductor layer and the second oxide semiconductor layer include an In—Ga—Zn—O-based oxide semiconductor.

16. The memory device according to claim 10,
wherein a height of a top surface of the first insulating film and that of a top surface of the third gate electrode are substantially the same.

17. A memory module comprising the memory device according to claim 10.

18. An electronic device comprising the memory device according to claim 10.

* * * * *

UNITED STATES PATENT AND TRADEMARK OFFICE
CERTIFICATE OF CORRECTION

PATENT NO. : 8,421,081 B2
APPLICATION NO. : 13/331645
DATED : April 16, 2013
INVENTOR(S) : Kiyoshi Kato et al.

It is certified that error appears in the above-identified patent and that said Letters Patent is hereby corrected as shown below:

In the Specification:

Column 10, line 36, replace "1010" with --101C--;

Column 12, line 2, replace "charge; discharge" with --charge/discharge--;

Column 25, line 28, after "Formula" replace "I" with --1--;

Column 25, line 66, replace "Ware" with --$W$ are--;

Column 25, line 66, replace "μM" with --μm--;

Column 27, line 19, after "33" replace "μm" with --nm--;

Column 27, line 20, after "40" replace "μm" with --nm--;

Column 27, line 39, after "10" replace "mm." with --nm.--;

Column 27, line 46, after "mobility" replace "p" with --μ--;

Column 27, line 66, after "mobility" replace "p" with --μ--.

Signed and Sealed this
Thirteenth Day of August, 2013

Teresa Stanek Rea
*Acting Director of the United States Patent and Trademark Office*